United States Patent
Eriguchi et al.

(10) Patent No.: US 7,892,720 B2
(45) Date of Patent: Feb. 22, 2011

(54) NEGATIVE PHOTOSENSITIVE FLUORINATED AROMATIC RESIN COMPOSITION

(75) Inventors: Takeshi Eriguchi, Chiyoda-ku (JP); Hiromasa Yamamoto, Chiyoda-ku (JP); Kaori Tsuruoka, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/210,375

(22) Filed: Sep. 15, 2008

(65) Prior Publication Data

US 2009/0017265 A1  Jan. 15, 2009

Related U.S. Application Data

(63) Continuation of application No. PCT/JP2007/055288, filed on Mar. 15, 2007.

(30) Foreign Application Priority Data

Mar. 16, 2006 (JP) ............... 2006-072412
Oct. 26, 2006 (JP) ............... 2006-291396

(51) Int. Cl.
  G03F 7/027 (2006.01)
  G03F 7/025 (2006.01)
  G03F 7/028 (2006.01)
  G03F 7/20 (2006.01)
  G03F 7/30 (2006.01)

(52) U.S. Cl. ............... 430/270.1; 430/271.1; 430/286.1; 430/287.1; 430/306; 430/311; 430/319; 430/321; 430/325; 430/914; 430/916; 430/9

(58) Field of Classification Search ............... None
  See application file for complete search history.

(56) References Cited

U.S. PATENT DOCUMENTS

| | | | |
|---|---|---|---|
| 3,957,512 A | 5/1976 | Kleeberg et al. | |
| 4,040,831 A | 8/1977 | Rubner et al. | |
| 4,093,461 A | 6/1978 | Loprest et al. | |
| 4,243,743 A | 1/1981 | Hiramoto et al. | |
| 4,339,521 A | 7/1982 | Ahne et al. | |
| 4,608,333 A | 8/1986 | Ohbayashi et al. | |
| 4,845,183 A | 7/1989 | Mueller et al. | |
| 4,927,736 A | 5/1990 | Mueller et al. | |
| 5,262,280 A * | 11/1993 | Knudsen et al. | 430/312 |
| 5,585,450 A | 12/1996 | Oaks et al. | |
| 6,083,661 A | 7/2000 | Oaks et al. | |
| 6,361,926 B1 | 3/2002 | So et al. | |
| 6,881,811 B2 | 4/2005 | Yokotsuka et al. | |
| 7,538,177 B2 * | 5/2009 | Eriguchi et al. | 528/205 |
| 2004/0076911 A1 | 4/2004 | So et al. | |
| 2004/0147710 A1 * | 7/2004 | Yokotsuka et al. | 528/86 |
| 2006/0173129 A1 | 8/2006 | Yokotsuka et al. | |
| 2008/0132669 A1 | 6/2008 | Eriguchi et al. | |

FOREIGN PATENT DOCUMENTS

| | | |
|---|---|---|
| EP | 0 264 678 | 4/1988 |
| JP | 54-145794 | 11/1979 |
| JP | 55-30207 | 8/1980 |
| JP | 55-41422 | 10/1980 |
| JP | 59-160140 | 9/1984 |
| JP | 62-145239 | 6/1987 |
| JP | 63-96162 | 4/1988 |
| JP | 08-022118 | 1/1996 |
| JP | 11-282160 | 10/1999 |
| JP | 3213001 | 7/2001 |
| JP | 2002-356551 | 12/2002 |
| WO | 03-099915 | 12/2003 |
| WO | WO2005/030837 A1 * | 4/2005 |
| WO | WO2006/137327 A1 * | 12/2006 |

OTHER PUBLICATIONS

U.S. Appl. No. 12/277,598, filed Nov. 25, 2008, Ito, et al.
Polyfile, vol. 35 [part 2], p. 31 (1998).
Polymer Preprints Japan, vol. 46 [part 3], p. 526 (1997).

* cited by examiner

Primary Examiner—Sin J. Lee
(74) Attorney, Agent, or Firm—Oblon, Spivak, McClelland, Maier & Neustadt, L.L.P.

(57) ABSTRACT

To provide a negative photosensitive fluorinated aromatic resin composition having a low relative permittivity, low water absorptivity, high heat resistance and high productivity.

A negative photosensitive fluorinated aromatic resin composition comprising the following fluorinated aromatic prepolymer, a photosensitizer and a solvent. Here the fluorinated aromatic prepolymer is a fluorinated aromatic prepolymer which is obtained by subjecting either one or both of a compound (Y-1) having a crosslinkable functional group (A) and a phenolic hydroxyl group, and a compound (Y-2) having a crosslinkable functional group (A) and a fluorinated aromatic ring, to a condensation reaction in the presence of a HF-removing agent, with a fluorinated aromatic compound (B) represented by the following formula (1):

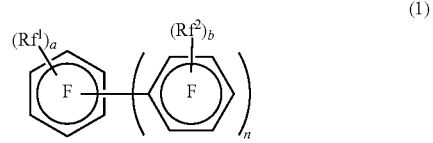

(1)

(wherein n is an integer of from 0 to 3, each of a and b which are independent of each other, is an integer of from 0 to 3, each of $Rf^1$ and $Rf^2$ is a fluorinated alkyl group having at most 8 carbon atoms, and F in the aromatic ring represents that hydrogen atoms of the aromatic ring are all substituted by fluorine atoms), and a compound (C) having at least 3 phenolic hydroxyl groups, and which has crosslinkable functional groups (A) and ether bonds and has a number average molecular weight of from $1\times10^3$ to $5\times10^5$.

12 Claims, No Drawings

NEGATIVE PHOTOSENSITIVE FLUORINATED AROMATIC RESIN COMPOSITION

TECHNICAL FIELD

The present invention relates to a negative photosensitive fluorinated aromatic resin composition, a fluorinated aromatic resin film obtainable by using the composition and a component having the resin film.

BACKGROUND ART

In the field of electronics, a dielectric material is widely utilized for e.g. a semiconductor, an interposer, a flat panel display, an interlayer insulation film such as a multi-chip module, a bumping for a redistribution layer, a passivation/stress buffer layer or a buildup layer for a printed wiring board. Usually, as a patterning method thereof (a pattern (concavo-convex shape) forming method), dry etching, wet etching, screen printing, inkjet printing or photo-lithography employing photosensitivity of a dielectric material itself may be mentioned.

A material having photosensitivity by itself requires no photoresist which is required at the time of patterning a non-photosensitive material, whereby it is expected to be possible to reduce the number of production steps and improve the productivity by e.g. an improvement in yield. Further, such a material has attracted attention very much since it is thereby possible to reduce the amount of a solvent to be used, thereby to reduce the load to the environment in the process step.

As a heat resistant photosensitive material having photosensitivity, a photosensitive polyimide has been well-known. The photosensitive characteristics are classified into a negative type and a positive type. In the case of a negative type, a photosensitive material is insolubilized at a portion irradiated with light. A soluble portion (non-irradiated portion) is removed by an organic solvent in a developer, followed by heat treatment to obtain a resin film having a pattern formed thereon (for example, see Patent Documents 1 to 4). Further, hereinafter, the resin film having a pattern formed itself is sometimes referred to simply as "pattern". In the case of a positive type, a portion irradiated with light is solubilized in a developer. As the developer, usually, an aqueous alkali solution is widely used. In the same manner as in the case of a negative type, a soluble portion is removed by a developer, followed by heat treatment to obtain a pattern (For example, see Patent Documents 5 to 8). In various materials other than polyimides, a negative type or positive type photosensitive material has been studied (for example, see Patent Documents 9 to 13, and Non-Patent Documents 1 and 2).

Patent Document 1: JP-B-55-030207
Patent Document 2: JP-B-55-041422
Patent Document 3: JP-A-54-145794
Patent Document 4: JP-A-59-160140
Patent Document 5: JP-A-62-145239
Patent Document 6: U.S. Pat. No. 4,093,461
Patent Document 7: U.S. Pat. No. 4,845,183
Patent Document 8: JP-A-63-096162
Patent Document 9: U.S. Pat. No. 4,339,521
Patent Document 10: JP-A-8-22118
Patent Document 11: Japanese Patent No. 3213001
Patent Document 12: U.S. Pat. No. 6,361,926
Patent Document 13: U.S. Patent application publication No. 2004/76911

Non-Patent Document 1: Polyfile, volume 35 [part 2], page 31 (1998)
Non-Patent Document 2: Polymer Preprints Japan, volume 46 [part 3], page 526 (1997)

DISCLOSURE OF THE INVENTION

Problems that the Invention is to Solve

However, the photosensitive material as mentioned above had the following problems.

Polyimide disclosed in Patent Documents 1 to 8 had high heat resistance and mechanical strength, but had high permittivity and high water absorption, whereby there were problems in performance and reliability of devices. Further, a high temperature and long time were required since dehydration was accompanied during forming an imide ring, and therefore there were problems in productivity.

With regard to polybenzoxazole as mentioned in Patent Documents 9 to 10 and Non-Patent Documents 1 to 2, permittivity and water absorption were somewhat good, but a high temperature and long time were required since dehydration was accompanied in the same manner as in polyimide during forming a benzoxazole ring, and therefore there were problems in productivity.

With regard to polybenzocyclobutene as mentioned in Patent Documents 11 to 12, both of permittivity and water absorption are low, but the softening temperature of a prepolymer is low at the time of obtaining a cured product. Accordingly, if the temperature is suddenly increased to a desired curing temperature, a pattern shape obtained by exposure and development steps is likely to be deformed, therefore it is necessary to increase the temperature in multi-stages (for example, the temperature is increased to 150° C. and then kept for a predetermined period of time, and the temperature is further increased to 210° C. and then kept for a predetermined period of time), and therefore there was a problem in productivity. Further, there was also a problem in heat resistance, such as weight reduction at the time of being kept at a high temperature.

The present invention has been made under these circumstances, and it is an object of the present invention to provide a negative photosensitive fluorinated aromatic resin composition having both of a low relative permittivity and low water absorption, and further having both of high heat resistance and high productivity.

Means of Solving the Problems

The present invention provides a negative photosensitive fluorinated aromatic resin composition comprising the following fluorinated aromatic prepolymer, at least one photosensitizer and at least one solvent, wherein the fluorinated aromatic prepolymer is a fluorinated aromatic prepolymer which is obtained by subjecting either one or both of a compound (Y-1) having a crosslinkable functional group (A) and a phenolic hydroxyl group and a compound (Y-2) having a crosslinkable functional group (A) and a fluorinated aromatic ring, to a condensation reaction in the presence of a HF-removing agent, with a fluorinated aromatic compound (B) represented by the following formula (1):

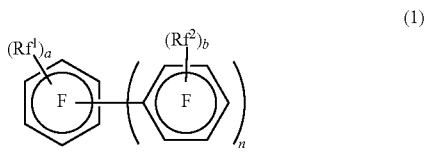

(1)

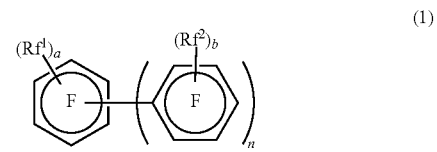

(1)

(wherein n is an integer of from 0 to 3, each of a and b which are independent of each other, is an integer of from 0 to 3, each of $Rf^1$ and $Rf^2$ which may be the same or different from each other, is a fluorinated alkyl group having at most 8 carbon atoms, and F in the aromatic ring represents that hydrogen atoms of the aromatic ring are all substituted by fluorine atoms), and a compound (C) having at least 3 phenolic hydroxyl groups, and which has crosslinkable functional groups (A) and ether bonds and has a number average molecular weight of from $1\times10^3$ to $5\times10^5$. Here the above photosensitizer is preferably a photo initiator, a photoacid generator, a photobase generator or a photocrosslinking agent.

Further, the present invention provides a fluorinated aromatic resin film having a concavo-convex shape, which is obtained by coating a substrate with the above negative photosensitive fluorinated aromatic resin composition to form a negative photosensitive fluorinated aromatic resin composition film, followed by exposure to carry out development. Further, the present invention provides an electric component, electronic component or optical component having the above fluorinated aromatic resin film.

EFFECT OF THE INVENTION

The negative photosensitive fluorinated aromatic resin composition of the present invention requires no resist since the resin composition itself has photosensitivity in a case where a resin film having a concavo-convex shape is obtained by a photo-lithography method. Further, the resin film obtained satisfies low permittivity, low water absorption and high heat resistance at the same time. Accordingly, it is possible to improve electrical characteristics of a device. Further, such a resin film is hardly susceptible to damage by moisture and heat, and therefore it is possible to improve both of electrical characteristics and the reliability.

Further, the fluorinated aromatic prepolymer of the present invention is capable of forming a cured film excellent in flexibility, and therefore it is possible to obtain a film strong against an external force such as bending, and it becomes easy to form a thick film.

BEST MODE FOR CARRYING OUT THE INVENTION

Prepolymer

The fluorinated aromatic prepolymer of the present invention (hereinafter referred to simply as the prepolymer) is characterized in that it is obtained by subjecting either one or both of a compound (Y-1) having a crosslinkable functional group (A) and a phenolic hydroxyl group, and a compound (Y-2) having a crosslinkable functional group (A) and a fluorinated aromatic ring, to a condensation reaction in the presence of a HF-removing agent, with a fluorinated aromatic compound (B) represented by the following formula (1):

(wherein n is an integer of from 0 to 3, each of a and b which are independent of each other, is an integer of from 0 to 3, each of $Rf^1$ and $Rf^2$ which may be the same or different from each other, is a fluorinated alkyl group having at most 8 carbon atoms, and F in the aromatic ring represents that hydrogen atoms of the aromatic ring are all substituted by fluorine atoms), and a compound (C) having at least 3 phenolic hydroxyl groups, and it has crosslinkable functional groups (A) and ether bonds and has a number average molecular weight of from $1\times10^3$ to $5\times10^5$.

The prepolymer of the present invention is produced by using the compound (C) having at least three phenolic hydroxyl groups and has crosslinkable functional groups (A), whereby it is possible to obtain a cured product (a fluorinated aromatic polymer) satisfying low permittivity, low water absorption and high heat resistance simultaneously. Namely, by using the compound (C) having at least three phenolic hydroxyl groups, it is possible to introduce branched structures to the polymer chain to make the molecular structure three dimensional thereby to increase the free volume of the polymer, whereby low densification i.e. a low permittivity can be accomplished. Further, usually, a linear chain polymer having aromatic rings is likely to undergo orientation of molecules due to stacking of aromatic rings, but with the cured product of the present invention, orientation of molecules is suppressed by the introduction of branched structures, and consequently, the birefringence will be small.

By the presence of the crosslinkable functional groups (A), in the obtainable cured product, a crosslinking or chain-extending reaction among prepolymer molecules can be promoted, and consequently, the heat resistance will be substantially improved. At the same time, there is also an effect such that the solvent resistance of the cured product will be improved.

Further, by the use of the fluorinated aromatic compound (B) represented by the above formula (1), it is possible to obtain a cured product having excellent flexibility. As compared with a fluorinated aromatic polymer produced from a fluorinated aromatic compound having a branched structure in itself, it is possible to increase the density of ether bonds, whereby flexibility of the main chain will be improved, and consequently, it is possible to obtain a cured product having excellent flexibility. The flexibility being excellent is advantageous particularly when the cured product is in the form of a cured film.

Fluorinated Aromatic Compound (B)

In the present invention, the fluorinated aromatic compound (B) is a fluorinated aromatic compound represented by the above formula (1) In this formula (1), each of $Rf^1$ and $Rf^2$ is a fluorinated alkyl group having at most 8 carbon atoms, preferably at most 3 carbon atoms. Especially, from the viewpoint of the heat resistance, a perfluoroalkyl group is preferred. As a specific example, a perfluoromethyl group, a perfluoroethyl group, a perfluoropropyl group, a perfluorobutyl group, a perfluorohexyl group or a perfluorooctyl group may be mentioned.

If the number of $Rf^1$ or $Rf^2$ increases, it tends to be difficult to produce the fluorinated aromatic compound (B). Accordingly, the number (a or b) of $Rf^1$ or $Rf^2$ is independently preferably from 0 to 2, most preferably 0.

In the formula (1), n is an integer of from 0 to 3, preferably from 1 to 3.

The fluorinated aromatic compound (B) is preferably perfluorobenzene, perfluorotoluene or perfluoroxylene when n=0; perfluorobiphenyl when n=1; perfluoroterphenyl when n=2; and perfluoro(1,3,5-triphenylbenzene) or perfluoro(1,2,4-triphenylbenzene) when n=3, particularly preferably perfluorotoluene, perfluoro(1,3,5-triphenylbenzene), perfluoro(1,2,4-triphenylbenzene) or perfluorobiphenyl. These compounds may be used alone or in combination as a mixture of two or more of them. When n=3, it is possible to improve the heat resistance of a cured product since a branched structure is introduced into the prepolymer. As the fluorinated aromatic compound (B), perfluorobiphenyl is most preferred, since the cured product thereby obtainable will be excellent in the balance of the permittivity and the heat resistance, and the flexibility of the cured product will be high.

Compound (C) Having at Least Three Phenolic Hydroxyl Groups

In the present invention, the compound (C) having at least three phenolic hydroxyl groups is preferably a polyfunctional phenol. The number of phenolic hydroxyl groups in the compound (C) is at least 3, practically preferably from 3 to 6, particularly preferably from 3 to 4. As a specific example, trihydroxybenzene, trihydroxybiphenyl, trihydroxynaphthalene, 1,1,1-tris(4-hydroxyphenyl)ethane, tris(4-hydroxyphenyl)benzene, tetrahydroxybenzene, tetrahydroxybiphenyl, tetrahydroxybinaphthyl or a tetrahydroxyspiroindane may, for example, be mentioned. As the compound (C), a compound having three phenolic hydroxyl groups, is preferred, since the flexibility of a cured film thereby obtainable will be high, and especially, trihydroxybenzene or 1,1,1-tris(4-hydroxyphenyl)ethane is most preferred, since the permittivity of a cured product thereby obtainable will be low.

Crosslinkable Functional Group (A)

The prepolymer of the present invention contains crosslinkable functional groups (A). Such crosslinkable functional groups (A) are reactive functional groups which do not substantially undergo a reaction during the production of the prepolymer, and which undergo a reaction with a photosensitizer at the time of forming a pattern by exposure, or a reaction when an external energy is given at the time of preparing a cured product such as a coating, a film or a molded product or at an optional point of time after the preparation, to induce crosslinking or chain extension among prepolymer molecules.

As the above external energy, heat, electron beams, etc. or a combination thereof is preferred in view of the excellent applicability to the production of electronic devices, multilayer wiring boards or optical transmission devices and/or to the packaging process.

In a case where heat is employed as the external energy, reactive functional groups which react at a temperature of from 40° C. to 500° C. are preferred. If the reaction temperature of the functional groups is too low, the stability cannot be secured during the storage of a prepolymer or a photosensitive fluorinated aromatic resin composition containing the prepolymer, and if it is too high, the prepolymer itself tends to undergo heat decomposition during the reaction. Accordingly, the reaction temperature is preferably within the above range, more preferably from 60° C. to 400° C., most preferably from 70° C. to 350° C.

Light may be employed as the external energy. Namely, in a case where light (light having a different wavelength from the exposure for obtaining a pattern) is further applied in addition to the exposure for obtaining a pattern, it is also preferred to further incorporate a photoradical initiator, a photoacid generator, a sensitizer, etc. suitable to light having a specific wavelength, into the prepolymer or to the after-mentioned photosensitive fluorinated aromatic resin composition containing the prepolymer.

Further, crosslinkable functional groups (A) containing no polar groups will not increase the relative permittivity of a cured film. Accordingly, it is preferred to employ crosslinkable functional groups (A) containing no polar groups, especially when the prepolymer of the present invention is employed for the production of an insulation film.

Specific examples of the crosslinkable functional groups (A) include, for example, vinyl groups, allyl groups, methacryloyl(oxy) groups, acryloyl(oxy) groups, vinyloxy groups, trifluorovinyl groups, trifluorovinyloxy groups, ethynyl groups, 1-oxocyclopenta-2,5-diene-3-yl groups, cyano groups, alkoxysilyl groups, diarylhydroxymethyl groups and hydroxyfluorenyl groups. Vinyl groups, methacryloyl(oxy) groups, acryloyl(oxy) groups, trifluorovinyloxy groups or ethynyl groups are preferably employed, since the reactivity is high, and a high crosslinking density can be obtained. Ethynyl groups or vinyl groups are preferred since a cured product thereby obtainable will have excellent heat resistance.

The content of the crosslinkable functional groups (A) in the prepolymer of the present invention is such that the crosslinkable functional groups (A) are preferably from 0.1 to 4 mmol, more preferably from 0.2 to 3 mmol, per gram of the prepolymer. If the content exceeds this range, brittleness of a cured product tends to increase, and the relative permittivity may sometimes increase. On the other hand, if it is smaller than this range, the heat resistance and the solvent resistance of the cured product may sometimes decrease.

Process for Producing Prepolymer

The prepolymer of the present invention may be produced by either one or both of the following methods (i) and (ii).

(i) A method wherein the fluorinated aromatic compound (B) represented by the above formula (1), the compound (C) having at least three phenolic hydroxyl groups and the compound (Y-1) having a crosslinkable functional group (A) and a phenolic hydroxyl group are subjected to a condensation reaction in the presence of a HF-removing agent.

(ii) A method wherein the fluorinated aromatic compound (B), the compound (C) having at least three phenolic hydroxyl groups and the compound (Y-2) having a crosslinkable functional group (A) and a fluorinated aromatic ring are subjected to a condensation reaction in the presence of a HF-removing agent.

Further, in a case where the prepolymer is produced by both of the above (i) and (ii), the fluorinated aromatic compound (B), the compound (C), the compound (Y-1) and the compound (Y-2) are subjected to a condensation reaction in the presence of a HF-removing agent.

In either one of the above methods (i) and (ii), the condensation reaction may be carried out by reacting all of the compounds in one-step, or reacting the compounds separately in multi steps. Further, among such reaction materials, specific compounds may firstly be subjected to the reaction by priority, and then other compounds may be reacted therewith. In a case where the condensation reaction is carried out separately in multi steps, an intermediate product obtained in an intermediate point of the process may be used for a succeeding reaction (condensation reaction) after separated and purified from a reaction system. In the reaction, the starting materials may be introduced all together, successively or intermittently.

In the above methods for producing a prepolymer, the condensation reaction proceeds as follows. As shown in the following formula (2), an ether bond will be formed by e.g. a reaction mechanism wherein a phenoxy group derived from a phenolic hydroxyl group will attack the carbon atom to which a fluorine atom of the fluorinated aromatic compound (B) is bonded, and then the fluorine atom will be detached. Further, in a case where the compound (C) and/or (Y-1) has two phenolic hydroxyl groups present at an ortho position to each other, a dioxin skeleton may be formed as shown by the following formula (3) by e.g. a similar reaction mechanism.

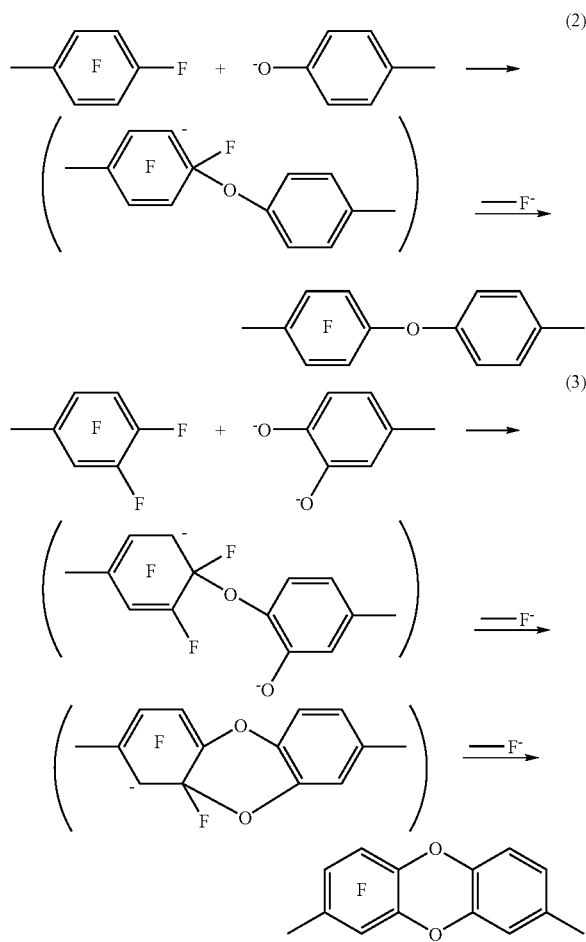

As the compound (Y-1) having a crosslinkable functional group (A) and a phenolic hydroxyl group to be used in the method (i), a compound (Y-1-1) having one phenolic hydroxyl group and a compound (Y-1-2) having two phenolic hydroxyl groups, are preferred.

Specific examples of the compound (Y-1-1) having a crosslinkable functional group (A) and one phenolic hydroxyl group include a phenol having a reactive double bond such as 4-hydroxystyrene; and an ethynyl phenol such as 3-ethynyl phenol, 4-phenylethynyl phenol or 4-(4-fluorophenyl)ethynyl phenol. They may be used alone or in combination as a mixture of two or more of them. More preferred is an aromatic compound having a vinyl group or an ethynyl group as the crosslinkable functional group (A).

Specific examples of the compound (Y-1-2) having a crosslinkable functional group (A) and two phenolic hydroxyl groups include a bis(phenylethynyl)dihydroxybiphenyl such as 2,2'-bis(phenylethynyl)-5,5'-dihydroxybiphenyl or 2,2'-bis(phenylethynyl)-4,4'-dihydroxybiphenyl; and a dihydroxydiphenylacetylene such as 4,4'-dihydroxytolan or 3,3'-dihydroxytolan. They may be used alone or in combination as a mixture of two or more of them.

As the compound (Y-2) having a crosslinkable functional group (A) and a fluorinated aromatic ring to be used in the method (ii), a compound having a crosslinkable functional group (A) and a perfluoro aromatic ring such as perfluorophenyl or perfluorobiphenyl, is preferred. Its specific examples include a fluorinated aryl having a reactive double bond, such as pentafluorostyrene, pentafluorobenzyl acrylate, pentafluorobenzyl methacrylate, pentafluorophenyl acrylate, pentafluorophenyl methacrylate, perfluorostyrene, pentafluorophenyltrifluorovinyl ether or 3-(pentafluorophenyl) pentafluoropropene-1; a fluorinated aryl having a cyano group, such as pentafluorobenzonitrile; a fluorinated aryl acetylene such as pentafluorophenyl acetylene or nonafluorobiphenyl acetylene; and a fluorinated diaryl acetylene such as phenylethynyl pentafluorobenzene, phenylethynyl nonafluorobiphenyl or decafluorotolan. They may be used alone or in combination as a mixture of two or more of them. As the compound (Y-2), a fluorinated aryl having a double bond or a fluorinated arylacetylene having a triple bond is preferred since the crosslinking reaction will thereby proceed at a relatively low temperature, and the heat resistance of a prepolymer cured product thereby obtained will be high.

As the HF-removing agent to be used for the production of the prepolymer of the present invention, a basic compound is preferred, and an alkali metal carbonate, hydrogen carbonate or hydroxide is particularly preferred. Specific examples include sodium carbonate, potassium carbonate, sodium hydrogen carbonate, potassium hydrogen carbonate, sodium hydroxide or potassium hydroxide.

With respect to the amount of the HF-removing agent to be used, in the method (i), it is required in an amount of at least equimolar, preferably from 1.1 to 3 times in a molar ratio to the total molar amount of phenolic hydroxyl groups in the compound (C) and the compound (Y-1). In the method (ii), it is required in an amount of at least equimolar, preferably from 1.1 to 3 times in a molar ratio to the molar amount of phenolic hydroxyl groups in the compound (C).

In the methods (i) and (ii), the condensation reaction is preferably carried out in a polar solvent. The polar solvent is preferably an aprotic polar solvent such as an amide such as N,N-dimethylacetamide, N,N-dimethylformamide or N-methylpyrrolidone; sulfoxide such as dimethyl sulfoxide; sulfone such as sulfolane, or an ether such as diethyl ether, tetrahydrofuran, dioxane, diethylene glycol diethyl ether or tryethylene glycol dimethyl ether.

To the polar solvent, toluene, xylene, benzene, tetrahydrofuran, benzotrifluoride, xylenehexafluoride or the like may be incorporated within a range not to deteriorate the solubility of the prepolymer to be formed or not to adversely affect the condensation reaction. By such incorporation, the polarity (the permittivity) of the solvent may be changed to control the reaction rate.

The condensation reaction conditions are preferably from 10 to 200° C. for from 1 to 80 hours, more preferably from 20 to 180° C. for from 2 to 60 hours, most preferably from 50 to 160° C. for from 3 to 24 hours.

The number average molecular weight of the prepolymer of the present invention is within a range of from $1×10^3$ to $5×10^5$, preferably from $1.5×10^3$ to $1×10^5$. Within this range, the coating properties of the after-mentioned photosensitive fluorinated aromatic resin composition containing such a prepolymer will be good, and the resulting cured film will have good heat resistance, mechanical properties, solvent resistance, etc.

In an application to an insulation film for electronic devices, a property to sufficiently penetrate into fine spaces of a substrate and to make the surface smooth (so-called gap-filling and planarization property) is required, the number average molecular weight of the prepolymer is most preferably within a range of from $1.5×10^3$ to $5×10^4$.

The number average molecular weight of the prepolymer can be controlled by changing the charging ratio of the fluorinated aromatic compound (B) to the sum of the compound (C) and the compound (Y-1) in the method (i). Here, it is preferred that no hydroxyl groups will remain in the prepolymer, since the relative permittivity will thereby be low.

In the condensation reaction in the production process (i), the fluorinated aromatic compound (B) usually functions as a bifunctional compound. Accordingly, control of the molecular weight is preferably adjusted within a range where the total molar amount of hydroxyl groups in the compound (C) and the compound (Y-1) will not exceed twice of the molar amount of the fluorinated aromatic compound (B).

Likewise, in the method (ii), the number average molecular weight of the prepolymer can be controlled by changing the charging ratio of the compound (C) to the sum of the fluorinated aromatic compound (B) and the compound (Y-2). Also here, in the same manner as mentioned above, control of the molecular weight is preferably adjusted within a range wherein the total molar amount of hydroxyl groups will not exceed the sum of the molar amount of the compound (Y-2) and twice the molar amount of the fluorinated aromatic compound (B), when the compound (Y-2) serves as a monofunctional compound. Further, when the compound (Y-2) serves as a bifunctional compound, it is preferably adjusted within a range wherein the total molar amount of hydroxyl groups will not exceed twice the total molar amount of the fluorinated aromatic compound (B) and the compound (Y-2).

Further, in the method (ii), in a case where the reaction rates of the fluorinated aromatic compound (B) and the compound (Y-2) are different, the molecular weight or composition of the prepolymer thereby obtainable may sometimes be different depending upon the order of addition. For example, in a case where the reaction rates to phenoxy groups derived from the phenolic hydroxyl group of the compound (C) are (B)>(Y-2), if the fluorinated aromatic compound (B) and the compound (Y-2) are charged simultaneously, all phenoxy groups may be consumed by the fluorinated aromatic compound (B) before all the compound (Y-2) is consumed, whereby a non-reacted compound (Y-2) may remain. In such a case, in order to increase the reaction ratio of the compound (Y-2), it is preferred that after charging the compound (Y-2) first, the fluorinated aromatic compound (B) is charged. However, in such a method, variation in the composition of the resulting prepolymer chains tends to be large. When it is required to minimize such variation in the composition of the resulting prepolymer chains, it is preferred to carry out the production by charging all at once.

In the method (i), the amount of the compound (C) to be used is preferably from 0.1 to 1 time, more preferably from 0.3 to 0.6 time, in a molar ratio to the fluorinated aromatic compound (B), and the amount of the compound (Y-1) to be used is preferably from 0.1 to 2 times, more preferably from 0.2 to 1.5 times, in a molar ratio to the fluorinated aromatic compound (B).

In the method (ii), the amount of the compound (C) to be used is preferably from 0.5 to 2 times, more preferably from 0.6 to 1.5 times, in a molar ratio to the fluorinated aromatic compound (B), and the amount of the compound (Y-2) is preferably from 0.1 to 2 times, more preferably from 0.2 to 1.5 times, in a molar ratio to the fluorinated aromatic compound (B).

When the respective amounts to be used are in such ranges, the resulting prepolymer will have a low permittivity and high heat resistance, such being desirable.

The prepolymer of the present invention may be produced by suitably selecting the method (i) or (ii), depending upon the physical properties such as the heat resistance, relative permittivity, birefringence and flexibility of the cured product obtainable after the curing. For example, in a case where the method (ii) is used, the relative permittivity and birefringence values of a cured product obtainable by curing the prepolymer thus produced usually tend to be low. Namely, to obtain a cured product having low relative permittivity and birefringence values, it is preferred to produce the prepolymer by the method (ii).

In the present invention, in a case where the coating or film made of the cured product of the prepolymer is brittle, a co-condensation component may be incorporated at the time of the production of the prepolymer to improve the flexibility of the cured product. Such a co-condensation component may, for example, be a compound (Z) having two phenolic hydroxyl groups other than (Y-1) in order to improve the flexibility of the cured film.

The compound (Z) having two phenolic hydroxyl groups may be a bifunctional phenol such as dihydroxybenzene, dihydroxybiphenyl, dihydroxyterphenyl, dihydroxynaphthalene, dihydroxyanthracene, dihydroxyphenanthracene, dihydroxy-9,9-diphenylfluorene, dihydroxydibenzofuran, dihydroxydiphenyl ether, dihydroxydiphenyl thioether, dihydroxybenzophenone, dihydroxy-2,2-diphenylpropane, dihydroxy-2,2-diphenylhexafluoropropane or dihydroxybinaphthyl. They may be used alone or in combination as a mixture of two or more of them.

After the condensation reaction or after formed into a solution, the prepolymer of the present invention is purified by a method such as neutralization, reprecipitation, extraction or filtration. The purification is preferably carried out in a state where the polar solvent preferably used during the production, is present, or in a state as dissolved or dispersed in the after-mentioned solvent, since the efficiency is thereby good. In an application as an insulation film for electronic devices or an insulation film for multilayer wiring boards, a metal such as potassium or sodium as a condensation reaction catalyst and free halogen atoms are likely to cause operation failure of a transistor or corrosion of wiring, and accordingly, it is preferred to sufficiently carry out the purification.

Additive to be Used in Combination with Prepolymer

In the present invention, for the purpose of e.g. increasing the reaction rate or reducing reaction defects during the crosslinking reaction for curing, various catalysts or additives may be employed with the above prepolymer.

In a case where the prepolymer contains ethynyl groups as the crosslinkable functional groups (A), the catalyst may, for example, be an amine such as aniline, triethylamine, aminophenyltrialkoxysilane or aminopropyltrialkoxysilane; or an organic metal compound containing molybdenum, nickel or the like.

As an additive, a biscyclopentadienone derivative is preferred. An ethynyl group and a cyclopentadienone group (a 1-oxocyclopenta-2,5-dien-3-yl group) undergoes a Diels-Alder reaction by heat to form an adduct, followed by a decarbon monoxide reaction to form an aromatic ring. Accordingly, if a biscyclopentadienone derivative is used, crosslinking or chain extension can be carried out wherein an aromatic ring constitutes a linkage moiety.

Specific examples of the biscyclopentadienone derivative include 1,4-bis(1-oxo-2,4,5-triphenyl-cyclopenta-2,5-dien-3-yl)benzene, 4,4'-bis(1-oxo-2,4,5-triphenyl-cyclopenta-2,5-dien-3-yl)biphenyl, 4,4'-bis(1-oxo-2,4,5-triphenyl-cyclopenta-2,5-dien-3-yl)1,1'-oxybisbenzene, 4,4'-bis(1-oxo-2,4,5-triphenyl-cyclopenta-2,5-dien-3-yl)1,1'-thiobisbenzene, 1,4-bis(1-oxo-2,5-di-[4-fluorophenyl]-4-phenyl-cyclopenta-2,5-dien-3-yl)benzene, 4,4'-bis(1-oxo-2,4,5-triphenyl-cyclopenta-2,5-dien-3-yl)1,1'-(1,2-ethanediyl)bisbenzene and 4,4'-bis(1-oxo-2,4,5-triphenyl-cyclopenta-2,5-dien-3-yl)1,1'-(1,3-propanediyl)bisbenzene.

Among these biscyclopentadienone derivatives, biscyclopentadienone derivatives having entirely aromatic skeletons are preferred from the viewpoint of the heat resistance. They may be used alone or in combination as a mixture of two or more of them.

Negative Photosensitive Fluorinated Aromatic Resin Composition

The negative photosensitive fluorinated aromatic resin composition of the present invention contains the above prepolymer, at least one photosensitizer and at least one solvent. Hereinafter, the negative photosensitive fluorinated aromatic resin composition is sometimes referred to simply as a photosensitive composition.

Photosensitizer

The photosensitizer to be used in a photosensitive composition of the present invention is one capable of reducing solubility of the prepolymer in a developing solution by inducing a reaction such as crosslinking reaction or polymerization by irradiation with light to increase the molecular weight of the prepolymer. In such a case, when the photosensitizer itself has no or small sensitivity to the irradiated light, it is possible to use a photoinitiation aid or a sensitizer in combination therewith. The photosensitizer may, for example, be a photoinitiator (a photoradical generator), a photoacid generator, a photobase generator or a photocrosslinking agent.

The photoinitiator may, for example, be a benzoine alkyl ether derivative, a benzophenone derivative, an α-aminoalkylphenone type, an oxime ester derivative, a thioxanthone derivative, an anthraquinone derivative, an acylphosphineoxide derivative, a glyoxyester derivative, an organic peroxide type, a trihalomethyltriazine derivative or a titanocene derivative.

Specifically, IRGACURE 651, IRGACURE 184, DAROCUR 1173, IRGACURE 500, IRGACURE 2959, IRGACURE 754, IRGACURE 907, IRGACURE 369, IRGACURE 1300, IRGACURE 819, IRGACURE 819DW, IRGACURE 1880, IRGACURE 1870, DAROCUR TPO, DAROCUR 4265, IRGACURE 784, IRGACURE OXE01, IRGACURE OXE02 or IRGACURE 250 (manufactured by Ciba Specialty Chemicals K.K.), KAYACURE DETX-S, KAYACURE CTX, KAYACURE BMS or KAYACURE 2-EAQ (manufactured by Nippon Kayaku Co., Ltd.), TAZ-101, TAZ-102, TAZ-103, TAZ-104, TAZ-106, TAZ-107, TAZ-108, TAZ-110, TAZ-113, TAZ-114, TAZ-118, TAZ-122, TAZ-123, TAZ-140 or TAZ-204 (manufactured by Midori Kagaku Co., Ltd.) may, for example, be mentioned.

Such a photoinitiator may be used alone or in combination as a mixture of two or more of them. A high sensitive initiator is desired since it is possible to carry out curing by a low irradiation energy.

IRGACURE 907 (α-aminoalkylphenone type), IRGACURE 369 (α-aminoalkylphenone type), DAROCUR TPO (acylphosphineoxide type), IRGACURE OXE01 (oxime ester derivative) or IRGACURE OXE02 (oxime ester derivative) is preferred, and DAROCUR TPO, IRGACURE OXE01 or IRGACURE OXE02 is particularly preferred.

The photoacid generator may, for example, be a diazodisulfone type, a triphenylsulfonium type, an iodonium salt type, a disulfone type or a sulfone type may, for example, be mentioned. Specifically, TPS-105, DPI-102, DPI-105, DPI-106, DPI-109, DPI-201, BI-105, MPI-103, MPI-105, MPI-106, MPI-109, BBI-102, BBI-103, BBI-105, BBI-106, BBI-109, BBI-110, BBI-201, BBI-301, TPS-102, TPS-103, TPS-105, TPS-106, TPS-109, TPS-1000, MDS-103, MDS-105, MDS-109, MDS-205, BDS-109, DTS-102, DTS-103, DTS-105, NDS-103, NDS-105, NDS-155, NDS159, NDS-165, DS-100, DS-101, SI-101, SI-105, SI-106, SI-106, SI-109, PI-105, PI-105, PI-109, NDI-101, NDI-105, NDI-106, NDI-109, PAI-101, PAI-106, PAI-1001, NAI-100, NAI-1002, NAI-1003, NAI-1004, NAI-101, NAI-105, NAI-106, NAI-109, DAM-101, DAM-102, DAM-103, DAM-105, DAM-201, Benzoin tosylate, MBZ-101, MBZ-201, MBZ-301, PYR-100, DNB-101, NB-101, NB-201, TAZ-100, TAZ-101, TAZ-102, TAZ-103, TAZ-104, TAZ-106, TAZ-107, TAZ-108, TAZ-109, TAZ-110, TAZ-113, TAZ-114, TAZ-118, TAZ-122, TAZ-123, TAZ-140, TAZ-201, TAZ-203, TAZ-204, NI-101, NI-1002, NI-1003, NI-1004, NI-101, NI-105, NI-106 or NI-109 (manufactured by Midori Kagaku Co., Ltd.), WPAG-145, WPAG-170, WPAG-199, WPAG-281, WPAG-336 or WPAG-367 (manufactured by Wako Pure Chemical Industries, Ltd.) may, for example, be mentioned.

The photobase generator may, for example, be a Co amine complex type, an oxime carboxylate type, a carbamate type or tetraammonium salt type may, for example, be mentioned. Specifically, TPS-OH, NBC-101 or ANC-101 (manufactured by Midori Kagaku Co., Ltd.) may, for example, be mentioned.

The photocrosslinking agent may be a bisazido type photocrosslinking agent. A bisazido type photocrosslinking agent produces an active nitrene due to decomposition of an azido group by irradiation with light, which undergoes addition to a double bond of a prepolymer or insertion reaction to a C—H bond of the prepolymer, thereby to cause a crosslinking reaction. The bisazido type photocrosslinking agent is highly sensitive, such being preferred. Specifically, 2,6-bis[3-(4-azidophenyl)-2-propenylidene]cyclohexanone, 2,6-bis[3-(4-azidophenyl)-2-propenylidene]-4-methylcyclohexanone, 2,6-bis[3-(4-azidophenyl)-2-propenylidene]-4-ethylcyclohexanone, 2,6-bis[3-(4-azidophenyl)-2-propenylidene]-4-propylcyclohexanone, p-azidophenylsulfone, m-azidophenylsulfone, 4,4'-diazidostilbene, 4,4'-diazidobenzalacetophenone, 2,3'-diazido-1,4-naphthoquinone or 4,4'-diazidodiphenylmethanemay, for example, be mentioned. Among them, 2,6-bis[3-(4-azidophenyl)-2-propenylidene]-4-methylcyclohexanone is particularly preferred.

The photoinitiation aid is one which is used together with a photoinitiator, whereby the initiation reaction is accelerated as compared with a case where the photoinitiator is used alone. Specifically, an amine, a sulfone, a phosphine or the like may be mentioned. More specifically, triethanolamine, methyldiethanolamine, triisopropanolamine, Michler ketone or 4-dimethylaminoethylbenzoate may, for example, be mentioned.

The sensitizer is one which absorbs radiation spectrum being not absorbed by a photoinitiator and is excited to transfer such absorbed energy to the photoinitiator thereby to induce an initiation reaction from the photoinitiator. The sensitizer may, for example, be a benzophenone derivative, an anthraquinone derivative or an acetophenone derivative.

The amount of the photosensitizer to be added is not particularly limited so long as the polymer is thereby insolubilized at the time of development. If such an amount is too small, a large amount of photoirradiation energy is required, and if such an amount is too large, electrical properties or mechanical properties of a cured film will be adversely affected. Such an amount is preferably from 0.1 to 30 parts by mass, more preferably from 1 to 10 parts by mass based on 100 parts by mass of a prepolymer.

Solvent

The solvent to be used for the photosensitive composition of the present invention is not particularly limited so long as the prepolymer, the photosensitizer and a catalyst or additives which may be added as the case requires, can be dissolved or dispersed therein. Further, types of the solvent are not particularly limited so long as it is possible to obtain a cured film having a desired thickness, uniformity or gap-filling and planarization property by a desired method. For example, an aromatic hydrocarbon, an aprotic polar solvent, a ketone, an ester, an ether or a halogenated hydrocarbon may be mentioned. The solvent may be the same or different from the solvent for the reaction for the production of the above-described prepolymer. If a different solvent is to be used, the prepolymer may once be collected from the reaction solution by e.g. a reprecipitation method and then dissolved or dispersed in a different solvent, or solvent substitution may be carried out by using a known method such as an evaporation method or an ultrafiltration method.

The aromatic hydrocarbon may, for example, be benzene, toluene, xylene, ethylbenzene, cumene, mesitylene, tetralin or methylnaphthalene.

The aprotic polar solvent may, for example, be N-methylpyrrolidone, N,N-dimethylformamide, N,N-dimethylacetamide, γ-butyrolactone or dimethylsulfoxide.

The ketone may, for example, be cyclopentanone, cyclohexanone, cycloheptanone, cyclooctanone or methyl amyl ketone.

The ether may, for example, be tetrahydrofuran, pyran, dioxane, dimethoxyethane, diethoxyethane, diphenylether, anisole, phenetole, diglyme or triglyme.

The ester may, for example, be ethyl lactate, methyl benzoate, ethyl benzoate, butyl benzoate, benzyl benzoate, methyl cellosolve acetate, ethyl cellosolve acetate, propylene glycol monomethyl ether, propylene glycol monoethyl ether, propylene glycol monopropyl ether, propylene glycol monobutyl ether, propylene glycol monomethyl ether acetate or propylene glycol monoethyl ether acetate.

The halogenated hydrocarbon may, for example, be carbon tetrachloride, chloroform, methylene chloride, tetrachloroethylene, chlorobenzene or dichlorobenzene.

Composition and so on of Photosensitive Composition

With respect to the photosensitive composition of the present invention, the concentration of the prepolymer in the photosensitive composition is preferably from 1 to 60 mass %, more preferably from 2 to 50 mass %. This photosensitive composition may contain, in addition to the prepolymer, the photosensitizer and the solvent, at least one type of additives selected from various additives well known in the coating field such as plasticizers and thickeners. Further, to form a film or coating having pores, the after-mentioned hollow bodies or a material which can be removed after forming a thin film may, for example, be suitably incorporated.

With respect to the blending portions of the prepolymer, the photosensitizer and the solvent as a main component to form a photosensitive composition, the blending portion of the prepolymer is from 1 to 60 mass %, preferably from 2 to 50 mass %, the blending portion of the photosensitizer is from 0.1 to 20 mass %, more preferably from 0.5 to 10 mass %, and the blending portion of the solvent is from 20 to 99 mass %, preferably from 30 to 98 mass %.

In a case where the prepolymer of the present invention contains a low molecular weight substance having a vapor-pressure, to prevent its evaporation during the baking, a part of the crosslinkable functional groups (A) may preliminarily be reacted in a solution. As such a method, heating is preferred. The heating conditions are preferably from 50 to 250° C. for from 1 to 50 hours, more preferably from 70 to 200° C. for from 1 to 20 hours. The reaction ratio in the solution of the crosslinkable functional groups is preferably less than 50%, more preferably less than 30%, with a view to preventing gelation of the prepolymer in the solution.

Method for Forming Concavo-Convex Shape

In the present invention, the above photosensitive composition is applied on a substrate to form a negative photosensitive fluorinated aromatic resin composition film, followed by exposure and development to obtain a fluorinated aromatic resin film having a concavo-convex shape. Hereinafter, a resin film finally obtainable is sometimes referred to simply as a cured film.

Formation of Film

A method for forming a negative photosensitive fluorinated aromatic resin composition film by applying the above photosensitive composition on a substrate, is carried out in such a manner that the photosensitive composition is firstly applied on a substrate to form a wet film, and such a wet film is subjected to prebaking, followed by drying to form a negative photosensitive fluorinated aromatic resin composition film.

As such a method for forming the wet film, it is preferred to employ a coating method. For example, a known coating method such as a spin coating method, a dip coating method, a spray coating method, a die-coating method, a bar coating method, a doctor coating method, an extrusion coating method, a scanning coating method, a brush coating method or a potting method may be mentioned. In a case where it is used as an insulation film for electronic devices, a spin coating method or a scanning coating method is preferred from the viewpoint of uniformity of the film thickness.

The thickness of the wet film to be formed by the photosensitive composition can be optionally set to match the shape of the desired cured film to be produced. For example, for the purpose of producing an insulation layer or film, it is preferred to form a wet film having a thickness of from about 0.01 to 500 μm on a substrate, and a thickness of from 0.1 to 300 μm is more preferred.

After forming the wet film, prebaking is carried out to evaporate the solvent. The heating conditions are preferably such a temperature that the crosslinkable functional group (A) of the prepolymer or additives such as a photosensitizer, a photoinitiation aid or a sensitizer is not substantially reacted, and preferably from 50 to 250° C. for from about 30 seconds to 10 minutes.

Exposure

Exposure is carried out by radiating a desired pattern shape with an actinic ray. As the actinic ray, e.g. an X-ray, an electron ray, a ultraviolet ray or a visible ray may be used, but one having a wavelength of from 200 to 500 nm is desirable.

As the actinic ray to apply for insolubilizing and patterning a part of a film, a light source containing a wavelength to be absorbed by e.g. a photosensitizer, such as an X-ray, an electron ray, a ultraviolet ray or a visible ray may be used as a preferred light source. A more preferred light source is a ultraviolet ray or a visible ray, and most preferred light source is a super high pressure mercury arc. A dose varies depending upon the film thickness and the type of e.g. a photosensitizer. In a case of a film having a thickness of 10 μm, an appropriate dose is from 100 to 2,000 mJ/cm$^2$. By using an exposure apparatus such as an aligner or a stepper, exposure is carried out through a mask in e.g. a pressure mode, a vacuum contact mode or a proximity mode, whereby it is possible to form a pattern having an exposed portion and a non-exposed portion on a film composition.

Subsequently to the exposure, it is possible to apply a bake step as the case requires. Such a step can increase a reaction rate of a photochemically-generated intermediate with a long operating life. Since the transfer ability of such an intermediate increases during such a step, it is possible to increase the contact probability with a reaction site and increase the reaction ratio by the transfer. Another method for increasing the transfer ability of such a reactive intermediate is such that heating is carried our in the exposure. Such a method increases the sensitivity of e.g. a photosensitizer. A baking temperature differs depending upon the type of the intermediate, but is preferably from 50 to 250° C.

Development

A film after the exposure is developed by a solvent. Such a developing method may be a method of e.g. spraying, paddling, immersion or ultrasonic wave. After a resin at a non-exposed portion is dissolved, an wafer is rinsed with a rinsing solution as the case requires, followed by spinning it at a high speed so as to dry the film.

Such a developing solvent to be used is a solvent in which a resin at the exposed portion is not or negligibly dissolved and a resin at the non-exposure portion is dissolved. Namely, it may be one in which a resin at a non-exposure portion can be dissolved. For example, an aromatic hydrocarbon, an aprotic polar solvent, a ketone, an ester, an ether or a halogenated hydrocarbon may be mentioned.

The atromatic hydrocarbon may, for example, be benzene, toluene, xylene, ethylbenzene, cumene, mesitylene, tetralin or methylnaphthalene.

The aprotic polar solvent may, for example, be N-methylpyrrolidone, N,N-dimethylformamide, N,N-dimethylacetamide, γ-butyrolactone or dimethylsulfoxid.

The ketone may, for example, be cyclopentanone, cyclohexanone, cycloheptanone, cyclooctanone or methyl amyl ketone.

The ether may, for example, be tetrahydrofuran, pyran, dioxane, dimethoxyethane, diethoxyethane, diphenyl ether, anisole, phenetole, diglyme or triglyme.

The ester may, for example, be ethyl lactate, methyl benzoate, ethyl benzoate, butyl benzoate, benzyl benzoate, methyl cellosolve acetate, ethyl cellosolve acetate, propylene glycol monomethyl ether, propylene glycol monoethyl ether, propylene glycol monopropyl ether, propylene glycol monobutyl ether, propylene glycol monoethyl ether acetate or propylene glycol monoethyl ether acetate.

The halogenated hydrocarbon may, for example, be carbon tetrachloride, chloroform, methylene chloride, tetrachloroethylene, chlorobenzene or dichllobenzene.

Rinsing is carried out as the case requires, but a rinsing solution is not particularly limited so long as it is the same one as the developing solvent, or one in which the prepolymer is less soluble than the developing solution and further compatible with the developing solution. Specifically, an alcohol, or the above-mentioned ketone or ester may be mentioned.

The alcohol may, for example, be methanol, ethanol, 1-propanol, 2-propanol, 1-butanol, 2-butanol, 1-pentanol, 2-pentanol, 3-pentanol, tert-amylalcohol or cyclohexanol.

A film developed by a solvent is baked so as to remove the solvent as the case requires. Such baking may be carried out on a hot plate or in an oven, and such baking is desirably carried out at a temperature of from 80 to 200° C. for from 0.5 to 60 minutes.

After a desired pattern is formed, a heat-resistant final pattern (cured film) is obtained by heat treatment. Heat conditions are preferably at from 150 to 450° C. for about from 1 to 300 minutes, more preferably at from 160 to 400° C. for from about 2 to 180 minutes.

The heating equipment is preferably a hot plate, an oven or a furnace. The heating atmosphere may, for example, be an atmosphere of an inert gas such as nitrogen or argon, an atmosphere of e.g. air or oxygen, or reduced pressure, and an inert gas atmosphere or a reduced pressure is preferred.

In order to secure the surface smoothness of the film or to improve fine space gap-filling properties of the thin film, it is preferred to add a prebake step at a temperature of from about 50 to 250° C. or to carry out the heating step as divided into a plurality of stages.

The reaction ratio of the crosslinkable functional groups (A) in the cured film is preferably from 30 to 100%. When the reaction ratio is at least 30%, the heat resistance and chemical resistance of the cured film will be good. From such a viewpoint, the reaction ratio is more preferably at least 50%, most preferably at least 70%.

Descum

There is a case where at a non-exposed portion, a remaining film is observed to some extent depending upon an exposure or development condition, and descum may be carried out as the case requires. As an etching gas for descum, oxygen gas, argon gas or fluorocarbon type gas may, for example, be mentioned. Further, the etching conditions are preferably such that the remaining film can be removed and further an influence on the film at the exposed portion can be minimized. Such conditions may, for example, be a gas flow rate of from 10 to 200 sccm (the unit is a volume (cm$^3$) flow rate per minute at a specified temperature), a treatment pressure of from 1 to 50 Pa, an output of from 10 to 1,000 W and a treatment time of from 1 to 600 seconds.

Additive

The cured film obtainable from the photosensitive composition of the present invention may be used as an insulation film or the like in a state as bonded on the substrate. In such a case, in order to improve the adhesion between the cured film and the substrate, an adhesion promoter may be used. As such an adhesion promoter, a silane coupling agent, a titanate coupling agent or an aluminum coupling agent may be mentioned, and preferred is a silane coupling agent such as an epoxysilane, an aminosilane or a vinylsilane.

The epoxysilane may, for example, be 2-(3,4-epoxycyclohexyl)ethyltrimethoxysilane, 3-glycidoxypropyltrimethoxysilane, 3-glycidoxypropylmethyldiethoxysilane or 3-glycidoxypropyltriethoxysilane.

The aminosilane may, for example, be an aliphatic aminosilane such as 3-aminopropylmethyldiethoxysilane or 3-aminopropyltriethoxysilane; or an aromatic group-containing aminosilane such as aminophenyltrimethoxysilane, aminophenyltriethoxysilane or N-phenyl-3-aminopropyltrimethoxysilane.

The vinylsilane may, for example, be vinyltrichlorosilane, vinyltrimethoxysilane or vinyltriethoxysilane.

As a method for applying the adhesion promoter, it is preferred to employ a method of treating the substrate with the adhesion promoter prior to coating with the photosensitive composition, or a method of adding the adhesion promoter to photosensitive composition.

As the method of treating the substrate with the adhesion promoter, in the case of an aminosilane, a method of spin-coating the substrate in the form of a 0.01 to 3 mass % solution in an alcohol. As such an alcohol, methanol, ethanol or 2-propanol is preferred.

In the method of adding the adhesion promoter in the prepolymer solution, the amount of the adhesion promoter to be added is preferably from 0.05 to 10 mass %, more preferably from 0.1 to 5 mass %, based on the contained prepolymer. If the amount of the adhesion promoter to be added is small, the effect for improving the adhesion tends to be inadequate, and if it is too large, the electrical properties or heat resistance tends to decrease.

Application of Cured Film

The cured film produced by using the photosensitive composition of the present invention may be used for e.g. protective films, film materials for various cells such as fuel cells, photoresists, optical waveguides, non-linear optical materials, covering materials, electronic components, encapsulation materials, over coating agents, transparent film materials, heat resistance/low moisture absorbing film materials, weather resistant coating materials, water repellents, oil repellents, moisture proof coating agents, or non-sticky coating agents. Particularly preferred is an application to insulation films for electronic devices or multilayer wiring boards, films or optical transmission devices. The present invention provides an electric, an electronic or an optical component having the cured film produced by using the above photosensitive composition.

Among electric, electronic or optical components to which the cured film of the present invention is applicable, as electronic devices, a discreet semiconductor such as a diode, a transistor, a compound semiconductor, a thermistor, a varistor or a thyristor, a memory device such as DRAM (dynamic random access memory), SRAM (static random access memory), EPROM (erasable programmable read only memory), mask ROM (mask read only memory), EEPROM (electrical erasable programmable read only memory) or a flash memory; a logic circuit device such as a microprocessor, DSP or ASIC; an integrated circuit device such as a compound semiconductor represented by MMIC (monolithic microwave integrated circuit); a photoelectric conversion device such as a hybrid integrated circuit (hybrid IC), a light emitting diode or a charge-coupled device; and a display device such as an amorphous silicon TFT (thin film transistor) or a polysilicon TFT may, for example, be mentioned.

Among the electric or electronic components to which the cured film (mainly, an insulation film) of the present invention is applicable, the multilayer wiring boards may be various substrates to mount electronic devices, etc. thereon and may, for example, be high density wiring boards such as a printed wiring board, a buildup wiring board, a MCM substrate and an interposer. Further, as an insulation film in such electric or electronic components, a buffer coating film, a passivation film, an interlayer insulation film, an insulation film for redistribution or an alpha ray shielding film may, for example, be mentioned.

The above optical transmission device is meant for a component which has a function to let light pass therethrough for transmission, branching, amplification or optical branching/multiplexing. The optical transmission device may, for example, be an optical fiber, a rod lens, an optical waveguide, an optical branching device, an optical multiplexer, an optical branching filter, an optical attenuator, an optical switch, an optical isolator, an optical transmitter module, an optical receiver module, a coupler, a deflector, a light wavelength conversion device, a light modulation device, an optical integrated circuit, a photoelectric hybrid circuit or a substrate itself or an optical transmission portion thereof.

The wavelength of light to be used for the optical transmission device is preferably within a range of from 600 to 1,600 nm, within such a range, 650 nm band, 850 nm band, 1,300 nm band or 1,550 nm band is preferred, since a component for e.g. a laser is thereby readily available.

Improvement in Properties of Cured Film

In an application to an insulation film for electronic devices or an insulation film for multilayer wiring boards employing the above cured film, in order to obtain an insulation film having a lower relative permittivity, it is preferred to provide pores in the insulation film. As a method for introducing such pores, the following methods (a) and (b) may, for example, be mentioned.

(a) A method wherein the prepolymer of the present invention and a polymer having a low heat decomposition temperature (hereinafter referred to as a heat-decomposable polymer) are complexed in the photosensitive composition of the present invention, and at the time of forming a cured film, the heat decomposable polymer portion is removed.

(b) A method wherein fine particles are added into the photosensitive composition of the present invention, and the fine particle portions are removed during or after forming the cured film.

In the method (a), the heat decomposable polymer may, for example, be an aliphatic polyether, an aliphatic polyester, an acrylic polymer or a styrene polymer. The molecular weight of the heat decomposable polymer is preferably from 1,000 to 100,000, more preferably from 1,000 to 50,000. When the molecular weight is within this range, the compatibility with the prepolymer of the present invention can be secured in the photosensitive composition, such being desirable.

As a method for complexing the prepolymer of the present invention and the heat decomposable polymer, a method may, for example, be mentioned wherein a photosensitive composition comprising a prepolymer and the heat decomposable polymer will be prepared and applied on a substrate, and then, the solvent is evaporated and heat treatment is carried out to obtain a composite film, or a method wherein the prepolymer and the heat decomposable prepolymer are complexed by blocking or grafting, and the composite thereby obtained is incorporated to the photosensitive composition.

As the method for blocking or grafting, a known method may be employed. For example, a method may be mentioned wherein a heat decomposable polymer having a fluorinated aromatic ring or a phenolic hydroxyl group at its terminal, is prepared, and it is co-condensed at the time of the condensation reaction for the preparation of the prepolymer. The condensation reaction for the prepolymer will proceed by the reaction mechanism of the above formula (2) or (3), whereby the terminal fluorinated aromatic ring or phenolic hydroxyl group moiety will be bonded to the prepolymer chain. Here, in a case where the heat decomposable polymer has a fluorinated aromatic ring or phenolic hydroxyl group at one terminal, it is possible to obtain a prepolymer having the heat decomposable polymer grafted. In a case where the heat decomposable polymer has a fluorinated aromatic ring or phenolic hydroxyl group at each terminal, it is possible to obtain a block product of the prepolymer and the heat decomposable polymer.

The heat decomposable polymer has a low heat decomposition temperature, and by the heating during the formation of an cured film, it is selectively decomposed and removed, and the removed portions will be pores. It is possible to control the porosity by the amount of the heat decomposable polymer added to the photosensitive composition, and the amount of the heat decomposable polymer to be added, is usually preferably form 5 to 80 vol %, more preferably from 10 to 70 vol %, based on the prepolymer.

In the method (b), the fine particles to be dispersed in the photosensitive composition of the present invention are preferably inorganic fine particles. As such inorganic fine particles, fine particles of silica, metal, etc. may be mentioned. The fine particles will be dissolved and removed by e.g. acid treatment after the film-forming, so that the removed portions will be pores. It is possible to control the porosity by the amount of the fine particles to be added. The amount of the fine particles to be added is usually preferably from 5 to 80 vol %, more preferably from 10 to 70 vol %, based on the prepolymer.

The cured film of the present invention may also be preferably complexed with another film. For example, in a case where it is used as a passivation film for a semiconductor device or as an interlayer insulation film for a semiconductor device, it is preferred to form an inorganic film as a lower layer and/or upper layer of the cured film.

The inorganic film may be formed by a normal pressure, reduced pressure or plasma chemical vapor deposition (CVD) method or a coating method and may, for example, be phosphorus and/or boron doped, as the case requires, silicon oxide film so-called PSG film or BPSG film, a silicon oxide film, a silicon nitride film, a silicon oxide nitride film, a SiOC film, or a spin-on-glass (SOG) film.

By forming an inorganic film between the metal wiring and the cured film, it is possible to obtain effects to prevent peeling of the metal wiring and to facilitate etching for e.g. a damascene structure. It is preferred to form the inorganic film on the cured film after partially removing the cured film by an etch back process or CMP (chemical mechanical polishing) process.

In a case where the adhesion between the cured film and the inorganic film is inadequate when the inorganic film is formed on the cured film or film reduction takes place at the time of forming the inorganic film, it is preferred to apply the following method (I) or (II).

(I) A method of forming a multilayer inorganic film: In a case where a silicon oxide film is formed by a plasma CVD process, when film reduction may occur depending upon e.g. a gas composition to be used, firstly, a thin inorganic film which undergoes no film reduction such as a silicon nitride film or a normal pressure CVD-silicon oxide film, is formed. Then, using this thin film as a barrier layer, a silicon oxide film is formed.

(II) A method of treating the cured film with energy rays: There is a case where the interface adhesion in the inorganic film and the cured film can be improved by treatment with energy rays. Such energy ray treatment may, for example, be electromagnetic waves in a broad sense including light, such as ultraviolet irradiation, laser irradiation or microwave irradiation. Or treatment by means of electron rays such as electron irradiation, glow discharge treatment, corona discharge treatment or plasma treatment may, for example, be mentioned. Among them, as a treating method suitable for a mass production process for semiconductor devices, UV irradiation, laser irradiation, corona discharge treatment or plasma treatment may be mentioned.

Plasma treatment is more preferred since a damage to semiconductor devices is thereby little. The apparatus for the plasma treatment is not particularly limited so long as a desired gas can be introduced into the apparatus and an electric field can be applied, and a commercially available barrel type or parallel flat plate type plasma generating apparatus may suitably be used. The gas to be introduced into the plasma apparatus is not particularly limited so long as it is capable of effectively activate the surface, and argon, helium, nitrogen, oxygen or a mixed gas thereof may, for example, be mentioned. Further, as a gas which is capable of activating the surface of the cured film and which brings about substantially no film reduction, a mixed gas of nitrogen and oxygen, or a nitrogen gas may be mentioned.

EXAMPLES

The present invention will be described in further detail with reference to the following Examples and Comparative Examples, but the present invention is by no means thereby restricted.

Further, the respective items were measured by the following methods.

Molecular Weight

A vacuum dried prepolymer powder was subjected to a gel permeation chromatography method (GPC) to obtain a number average molecular weight calculated as polystyrene. Tetrahydrofuran was used as the carrier solvent.

Relative Permittivity

A vacuum dried prepolymer powder was dissolved in cyclohexanone to obtain a 20 mass % solution, which was filtered through a PTFE filter having a pore diameter of 0.5 µm. Using the obtained solution, a wet film having a thickness of about 1 µm was formed by a spin coating method on a 4 inch silicon wafer. The spin conditions were 1,000 to 3,000 rpm for 30 seconds, and after prebaking by a hot plate at 100° C. for 90 seconds and 200° C. for 90 seconds, final baking was carried out in a nitrogen atmosphere in a vertical furnace at 320° C. for 30 minutes. Then, a CV measurement was carried out by a mercury prober (SSM-495, manufactured by SSM) to obtain a relative permittivity at 1 MHz. As the thickness of the cured film, a value obtained by a spectroellipsometer was used.

Exposure

Exposure was carried out by applying light of a super high pressure mercury lamp by using UL-7000 (manufactured by Quintel). Further, with regard to a non-exposed portion, a shading portion was formed by using a metallic foil or a mask.

Preparation Example 1

Into a 100 mL glass four-necked flask equipped with a Dimroth condenser, a thermocouple thermometer and a mechanical stirrer, pentafluorostyrene (1.0 g), 1,1,1-tris(4-hydroxyphenyl)ethane (2.4 g) and dimethylacetamide (hereinafter referred to as DMAc) (31.1 g) were charged. The mixture was heated on an oil bath with stirring, and when the liquid temperature became 60° C., sodium carbonate (3.8 g)

was quickly added, followed by heating at 60° C. for 24 hours with continuous stirring. Then, a solution having perfluoro-1,3,5-triphenylbenzene (5.0 g) dissolved in DMAc (45.0 g) was added, followed by further heating at 60° C. for 24 hours. Then the reaction solution was cooled to room temperature and the reaction solution was gradually added dropwise to about 200 ml of 0.5 N aqueous hydrochloric acid solution with vigorous stirring for reprecipitation. The precipitate was collected by filtration, washed twice with pure water and vacuum dried at 60° C. for 12 hours to obtain a white powdery prepolymer (6.9 g).

The obtained prepolymer had ether bonds and vinyl groups as the crosslinkable functional groups (A), and had a molecular weight of 5,300. A relative permittivity and light transmittance of a cured film formed from the prepolymer by the above-described method were measured. The relative permittivity was 2.4. Further, the light transmittances at 400 nm, 600 nm and 800 nm were 98%, 99.5% and 99.5%, respectively.

Confirmation of Ether Bond

A vacuum dried prepolymer powder was measured by IR, whereby absorption was confirmed in the vicinity of 1,300 $cm^{-1}$.

Confirmation of Crosslinkable Functional Group

A vacuum dried prepolymer powder was dissolved in acetone-d6, and NMR was measured, whereby a crosslinkable functional group was confirmed by the presence of a signal in a prescribed area. Signal appears in the vicinity of δ=5.0 to 7.0 ppm when the crosslinkable functional group is a vinyl group, and in the vicinity of δ=3.6 ppm when the crosslinkable functional group is an ethynyl group.

Transmittance

A vacuum dried prepolymer powder was dissolved in cyclohexanone to obtain a 30 masse solution, which was filtered through a PTFE filter having a pore diameter of 0.5 μm. Using the obtained solution, a cured film having a thickness of about 3 μm was formed by a spin coating method on a glass substrate. The spinning conditions were 1,000 to 3,000 revolutions per minute for 30 seconds, and after prebaking by a hot plate at 100° C. for 90 seconds and 200° C. for 90 seconds, final baking was carried out in a nitrogen atmosphere in a vertical furnace at 250° C. for one hour. Using the thin film formed on the glass substrate, the light transmittance at a wavelength of from 400 to 800 nm was measured by a spectrophotometer (UV-3100, manufactured by Shimadzu Corporation).

Preparation Example 2

Into a 100 mL glass four-necked flask equipped with a Dimroth condenser, a thermocouple thermometer and a mechanical stirrer, pentafluorostyrene (2.2 g), 1,1,1-tris(4-hydroxyphenyl)ethane (3.3 g) and DMAc (49.2 g) were charged. The mixture was heated on an oil bath with stirring, and when the liquid temperature became 60° C., sodium carbonate (5.1 g) was quickly added, followed by heating at 60° C. for 24 hours with continuous stirring. Then, a solution having perfluorobiphenyl (4.0 g) dissolved in DMAc (36.0 g) was added, followed by further heating at 60° C. for 17 hours. Then, the reaction solution was cooled to room temperature, and the reaction solution was gradually added dropwise to about 300 mL of 0.5 N aqueous hydrochloric acid solution with vigorous stirring for reprecipitation. The precipitate was collected by filtration, washed twice with pure water. And then, vacuum drying was carried out at 60° C. for 12 hours to obtain a white powdery prepolymer (7.5 g). The obtained prepolymer had ether bonds and vinyl groups. The same evaluation as in Preparation Example 1 was carried out, and results of evaluation of basic properties are shown in Table 1.

Preparation Example 3

Into a 100 mL glass four-necked flask equipped with a Dimroth condenser, a thermocouple thermometer and a mechanical stirrer, pentafluorostyrene (2.4 g), 1,1,1-tris(4-hydroxyphenyl)ethane (3.2 g) and DMAc (50.8 g) were charged. The mixture was heated on an oil bath with stirring, and when the liquid temperature became 60° C., sodium carbonate (5.0 g) was quickly added, followed by heating at 60° C. for 24 hours with continuous stirring. Then, a solution having perfluorobiphenyl (3.5 g) dissolved in DMAc (31.5 g) was added, followed by further heating at 60° C. for 17 hours. Then, the reaction solution was cooled to room temperature, and the reaction solution was gradually added dropwise to about 300 mL of 0.5 N aqueous hydrochloric acid solution with vigorous stirring for reprecipitation. The precipitate was collected by filtration, washed twice with pure water and vacuum dried at 60° C. for 12 hours to obtain a white powdery prepolymer (7.80 g). The obtained prepolymer had ether bonds and vinyl groups. The same evaluation as in Preparation Example 1 was carried out, and results of evaluation of basic properties are shown in Table 1.

Preparation Example 4

Into a 100 mL glass four-necked flask equipped with a Dimroth condenser, a thermocouple thermometer and a mechanical stirrer, pentafluorostyrene (1.7 g), 1,1,1-tris(4-hydroxyphenyl)ethane (3.4 g) and DMAc (46.0 g) were charged. The mixture was heated on an oil bath with stirring, and when the liquid temperature became 60° C., sodium carbonate (5.2 g) was quickly added, followed by heating at 60° C. for 24 hours with continuous stirring. Then, a solution having perfluorobiphenyl (4.5 g) dissolved in DMAc (40.5 g) was added, followed by further heating at 60° C. for 17 hours. Then, the reaction solution was cooled to room temperature, and the reaction solution was gradually added dropwise to about 300 mL of 0.5 N aqueous hydrochloric acid solution with vigorous stirring for reprecipitation. The precipitate was collected by filtration, washed twice with pure water. Then, vacuum drying was carried out at 60° C. for 12 hours to obtain a white powdery prepolymer (7.5 g).

The prepolymer obtained was re-dissolved in DMAc (48.0 g), and such a solution was gradually added dropwise to about 200 mL of 0.5N hydrochloric acid methanol solution for reprecipitation. The precipitate was collected by filtration, washed twice with water/methanol=2/1 (mass ratio). Then, vacuum drying was carried out at 60° C. for 12 hours to obtain a white powdery prepolymer (6.4 g). The prepolymer obtained had ether bonds and vinyl groups. The same evaluation as in Preparation Example 1 was carried out, and results of evaluation of basic properties are shown in Table 1.

Preparation Example 5

Into a 300 mL glass four-necked flask equipped with a Dimroth condenser, a thermocouple thermometer and a mechanical stirrer, pentafluorostyrene (2.7 g), 1,1,1-tris(4-hydroxyphenyl)ethane (9.9 g) and DMAc (114.2 g) were charged. The mixture was heated on an oil bath with stirring, and when the liquid temperature became 60° C., sodium carbonate (15.5 g) was quickly added, followed by heating at 60° C. for 24 hours with continuous stirring. Then, a solution having perfluorotoluene (10.0 g) dissolved in DMAc (90.0 g) was added, followed by further heating at 60° C. for 24 hours. Then, the reaction solution was cooled to room temperature, and the reaction solution was gradually added dropwise to about 600 mL of 0.5 N aqueous hydrochloric acid solution with vigorous stirring for reprecipitation. The precipitate was collected by filtration, washed twice with pure water and vacuum dried at 60° C. for 12 hours to obtain a white powdery prepolymer (17.9 g). The obtained prepolymer had ether bonds and vinyl groups. The same evaluation as in Preparation Example 1 was carried out, and results of evaluation of basic properties are shown in Table 1.

Preparation Example 6

Into a 100 mL glass four-necked flask equipped with a Dimroth condenser, a thermocouple thermometer and a mechanical stirrer, pentafluorostyrene (1.0 g), 1,1,2,2-tetrakis(4-hydroxyphenyl)ethane (2.3 g) and DMAc (30.1 g) were charged. The mixture was heated on an oil bath with stirring, and when the liquid temperature became 60° C., sodium carbonate (2.8 g) was quickly added, followed by heating at 60° C. for 24 hours with continuous stirring. Then, a solution having perfluoro-1,3,5-triphenylbenzene (5.0 g) dissolved in DMAc (45.0 g) was added, followed by further heating at 60° C. for 24 hours. Then, the reaction solution was cooled to room temperature, and the reaction solution was gradually added dropwise to about 250 mL of 0.5 N aqueous hydrochloric acid solution with vigorous stirring for reprecipitation. The precipitate was collected by filtration, washed twice with pure water and vacuum dried at 60° C. for 12 hours to obtain a white powdery prepolymer (7.0 g). The obtained prepolymer had ether bonds and vinyl groups. The same evaluation as in Preparation Example 1 was carried out, and results of evaluation of basic properties are shown in Table 1.

Preparation Example 7

Into a 100 mL glass four-necked flask equipped with a Dimroth condenser, a thermocouple thermometer and a mechanical stirrer, pentafluorostyrene (2.2 g), 1,1,2,2-tetrakis(4-hydroxyphenyl)ethane (3.2 g) and DMAc (48.1 g) were charged. The mixture was heated on an oil bath with stirring, and when the liquid temperature became 60° C., sodium carbonate (3.8 g) was quickly added, followed by heating at 60° C. for 24 hours with continuous stirring. Then, a solution having perfluorobiphenyl (4.0 g) dissolved in DMAc (36.0 g) was added, followed by further heating at 60° C. for 24 hours. Then, the reaction solution was cooled to room temperature, and the reaction solution was gradually added dropwise to about 250 mL of 0.5 N aqueous hydrochloric acid solution with vigorous stirring for reprecipitation. The precipitate was collected by filtration, washed twice with pure water and vacuum dried at 60° C. for 12 hours to obtain a white powdery prepolymer (7.5 g). The obtained prepolymer had ether bonds and vinyl groups. The same evaluation as in Preparation Example 1 was carried out, and results of evaluation of basic properties are shown in Table 1.

Preparation Example 8

Into a 100 mL glass four-necked flask equipped with a Dimroth condenser, a thermocouple thermometer and a mechanical stirrer, pentafluorostyrene (3.0 g), 1,1,2,2-tetrakis(4-hydroxyphenyl)ethane (3.9 g) and DMAc (61.6 g) were charged. The mixture was heated on an oil bath with stirring, and when the liquid temperature became 60° C., sodium carbonate (4.6 g) was quickly added, followed by heating at 60° C. for 24 hours with continuous stirring. Then, a solution having pentafluorotoluene (3.0 g) dissolved in DMAc (27.0 g) was added, followed by further heating at 60° C. for 24 hours. Then, the reaction solution was cooled to room temperature, and the reaction solution was gradually added dropwise to about 250 mL of 0.5 N aqueous hydrochloric acid solution with vigorous stirring for reprecipitation. The precipitate was collected by filtration, washed twice with pure water and vacuum dried at 60° C. for 12 hours to obtain a white powdery prepolymer (7.6 g). The obtained prepolymer had ether bonds and vinyl groups. The same evaluation as in Preparation Example 1 was carried out, and results of evaluation of basic properties are shown in Table 1.

Preparation Example 9

Into a 10 L glass four-necked flask equipped with a Dimroth condenser, a thermocouple thermometer and a mechanical stirrer, perfluorobiphenyl (450 g), pentafluorophenyl acetylene (155 g), 1,3,5-trihydroxybenzene (130 g), powdery molecular sieves 4A (600 g) and DMAc (6,620 g) were charged. The mixture was heated on an oil bath with stirring, and when the liquid temperature became 60° C., sodium carbonate (600 g) was quickly added, followed by heating at 60° C. for 45 hours with continuous stirring. Then, the reaction solution was cooled to room temperature, and the reaction solution was gradually added dropwise to about 27 L of 0.5 N aqueous hydrochloric acid solution with vigorous stirring for reprecipitation. The precipitate was collected by filtration, washed twice with pure water and vacuum dried at 60° C. for 12 hours to obtain a white powdery prepolymer (620 g). The obtained prepolymer had ether bonds and ethynyl groups. The same evaluation as in Preparation Example 1 was carried out, and results of evaluation of basic properties are shown in Table 1.

TABLE 1

| Prep. Ex. | Molecular weight | Relative permittivity | Light transmittance | | |
|---|---|---|---|---|---|
| | | | 400 nm | 600 nm | 800 nm |
| 1 | 5,300 | 2.4 | 98% | 99.5% | 99.5% |
| 2 | 6,500 | 2.5 | 98% | 99.5% | 99.5% |
| 3 | 4,200 | 2.5 | 98% | 99.5% | 99.5% |
| 4 | 7,700 | 2.5 | 98% | 99.5% | 99.5% |
| 5 | 3,600 | 2.5 | 98% | 99.5% | 99.5% |
| 6 | 6,700 | 2.5 | 98% | 99.5% | 99.5% |
| 7 | 5,800 | 2.6 | 98% | 99.5% | 99.5% |
| 8 | 4,800 | 2.6 | 98% | 99.5% | 99.5% |
| 9 | 9,000 | 2.5 | 52% | 98.0% | 99.0% |

Example 1

A cyclohexanone solution of the prepolymer in Preparation Example 9 (the concentration of the prepolymer in the solution was 30 mass %) was prepared (hereinafter referred to as "prepolymer solution 1"), 2.03 g of the prepolymer solution 1 was charged in a sample bottle, and 0.0013 g of 2,6-bis(4-azidobenzal)-4-methylcyclohexanone as a photosensitizer was added thereto and dissolved therein. Such a solution was spin-coated on an Si wafer at a rate of 1,850 revolutions per minute for 30 seconds, followed by heating at 100° C. for 90 seconds by a hot plate. Then, exposure was carried out at an irradiation energy of 1,530 mJ/cm$^2$. Then, the Si wafer was dipped in cyclohexanone for 20 seconds to carry out development, followed by spin drying at a rate of 2,000 revolutions per minute for 30 seconds. Then, such an Si wafer was heated at 100° C. for 90 seconds and 200° C. for 90 seconds by a hot plate. The film-thickness was measured, and found to be 0.47 µm. Such a film-thickness was 10% of the thickness of a reference film which was not subjected to the development step after the exposure. Here, in the following Examples, each numerical value in brackets subsequent to a film-thickness represents a proportion of a thickness to the thickness of such a reference film.

Example 2

The same film formation and evaluation as in Example 1 were carried out except that the amount of the prepolymer solution 1 was changed to 2.01 g, and the amount of 2,6-bis (4-azidobenzal)-4-methylcyclohexanone as a photosensitizer was changed to 0.0029 g, and the film-thickness was found to be 0.45 µm (10%).

Example 3

The same film formation and evaluation as in Example 1 were carried out except that the amount of the prepolymer solution 1 was changed to 2.01 g and the amount of 2,6-bis (4-azidobenzal)-4-methylcyclohexanone as a photosensitizer was changed to 0.0058 g, and the film thickness was found to be 1.57 µm (33%).

Example 4

The same film formation and evaluation as in Example 1 were carried out except that the amount of the prepolymer solution 1 was changed to 2.02 g and the amount of 2,6-bis (4-azidobenzal)-4-methylcyclohexanone as a photosensitizer was changed to 0.0171 g, and the film thickness was found to be 2.34 µm (50%).

Example 5

2.01 g of the prepolymer solution 1 was charged in a sample bottle, and 0.0029 g of IRGACURE 369 (manufactured by Ciba Specialty Chemicals K.K.) as a photosensitizer and 0.0018 g of KAYACURE DETX-S (manufactured by Nippon Kayaku Co., Ltd.) were added and dissolved therein. Such a solution was spin-coated on an Si wafer at a rate of 1,850 revolutions per minute for 30 seconds, followed by heating by a hot plate at 100° C. for 90 seconds. Then, exposure was carried out at an irradiation energy of 1,530 mJ/cm$^2$. Then, such an Si wafer was dipped in cyclohexanone for 20 seconds to carry out development, followed by spin drying at a rate of 2,000 revolutions per minute for 30 seconds. Then, heating was carried out by a hot plate at 100° C. for 90 seconds and 200° C. for 90 seconds. The film-thickness was 0.68 µm (14%).

Example 6

The same film-formation and evaluation as in Example 5 were carried out except that the amount of the prepolymer solution 1 was changed to 2.05 g, the amount of IRGACURE 369 as a photosensitizer was changed to 0.0059 g, and the amount of KAYACURE DETX-S was changed to 0.0030 g, and as a result the film thickness was found to be 3.42 µm (73%).

Example 7

The same film formation and evaluation as in Example 6 were carried out except that the rotational speed in the spin coating was changed to a rate of 1,000 revolutions per minute, and the film thickness was found to be 5.89 µm (82%).

Example 8

1.01 g of the prepolymer solution 1 was charged in a sample bottle, and 0.0016 g of IRGACURE OXE01 (manufactured by Ciba Specialty Chemicals K.K.) as a photosensitizer was added and dissolved therein. Such a solution was spin-coated on an Si wafer at a rate of 2,000 revolutions per minute for 30 seconds, followed by heating by a hot plate at 100° C. for 90 seconds. Such an Si wafer was subjected to exposure at an irradiation energy of 1,530 mJ/cm$^2$. The Si wafer was dipped in cyclohexanone for 20 seconds to carry out development, followed by spin drying at a rate of 2,000 revolutions per minute for 30 seconds. Then, heating was carried out by a hot plate at 100° C. for 90 seconds and 200° C. for 90 seconds. The film-thickness was measured, and found to be 0.45 µm (9.5%).

Example 9

The same film formation and evaluation as in Example 8 were carried out except that the amount of the prepolymer solution 1 was changed to 1.02 g, and the amount of IRGACURE OXE01 as a photosensitizer was changed to 0.0030 g, and as a result the film thickness was found to be 0.74 µm (15.6%).

Example 10

The same film-formation and evaluation as in Example 8 were carried out except that the amount of the prepolymer solution 1 was changed to 1.02 g, and the amount of IRGACURE OXE01 as a photosensitizer was changed to 0.0059 g, and as a result, the film thickness was found to be 2.8 µm (59%).

Example 11

The same film formation and evaluation as in Example 8 were carried out except that the amount of the prepolymer solution 1 was changed to 1.02 g, and the amount of IRGACURE OXE01 as a photosensitizer was changed to 0.0087 g, and as a result, the film thickness was found to be 2.92 µm (62%).

Example 12

Into a sample bottle, 0.30 g of the prepolymer in Preparation Example 2, 0.72 g of cyclohexanone, and 0.0095 g of 2,6-bis(4-azidobenzal)-4-methylcyclohexanone as a photosensitizer were charged and dissolved. 2-propanol solution (the concentration was 0.1 mass %) of 3-aminopropyltriethoxysilane was spin-coated on an Si wafer at a rate of 3,000 revolutions per minute for 30 seconds, followed by heating by a hot plate at 200° C. for 90 seconds. Then, such a prepolymer solution was spin-coated thereon at a rate of 1,000 revolutions per minute for 30 seconds, followed by heating by a hot plate at 100° C. for 90 seconds. Then, exposure was carried out at an irradiation energy of 1,530 mJ/cm$^2$. Then, the Si wafer was dipped in cyclohexanone for 20 seconds to carry out development, followed by spin drying at a rate of 2,000 revolutions per minute for 30 seconds. Then, heating was carried out by a hot plate at 100° C. for 90 seconds and 200° C. for 90 seconds. The film thickness was 0.92 µm (20%).

Example 13

In a sample bottle, 0.31 g of the prepolymer in Preparation Example 2, 0.78 g of cyclohexanone and 0.0096 g of IRGACURE OXE01 as a photosensitizer were charged and dissolved. A 2-propanol solution (the concentration was 0.1 mass %) of 3-aminopropyltriethoxysilane was spin-coated on an Si wafer at a rate of 3,000 revolutions per minute for 30 seconds, followed by heating by a hot plate at 200° C. for 90 seconds. Then, the prepolymer solution was spin-coated at a rate of 1,000 revolutions per minute for 30 seconds, followed by heating by a hot plate at 100° C. for 90 seconds. Then, exposure was carried out at an irradiation energy of 1,530 mJ/cm$^2$. Then, the Si wafer was dipped in cyclohexanone for 20 seconds to carry out development, followed by spin-drying at a rate of 2,000 revolutions per minute for 30 seconds. Then, heating was carried out by a hot plate at 100° C. for 90 seconds and at 200° C. for 90 seconds. The film thickness was 2.73 μm (57%).

Example 14

The same film formation and evaluation as in Example 13 were carried out except that the prepolymer was changed to 0.30 g of the prepolymer in Preparation Example 3, the amount of cyclohexanone was changed to 0.71 g, and 0.019 g of IRGACURE 369 and 0.0092 g of KAYACURE DETX-S were used in combination as a photosensitizer. The film thickness was found to be 0.15 μm (5%).

Example 15

The same film formation and evaluation as in Example 14 were carried out except that the prepolymer was changed to 0.30 g of the prepolymer in Preparation Example 2, and the amount of KAYACURE DETX-S was changed to 0.0090 g. The film thickness was found to be 0.86 μm (19%).

Preparation Example 10

3.03 g of the prepolymer in Preparation Example 2 was dissolved in 12.01 g of DMAc, and such a solution was added dropwise to 51 mL of a 2-propanol solution containing 0.5N hydrogen chloride for reprecipitation of a polymer. The precipitate was subjected to suction filtration and washed with 150 mL of a solution of 2-propanol/water=1/2 (volume ratio), followed by vacuum drying at 60° C. for 12 hours to obtain 2.79 g of a prepolymer. The molecular weight measured by GPC was 6,800.

Preparation Example 11

The same reprecipitation as in Preparation Example 10 was carried out except that the amount of the prepolymer in Preparation Example 2 was changed to 0.51 g, the amount of DMAc was changed to 2.06 g, and the reprecipitation solvent was changed to 10 mL of a solution of ASAHIKLIN AK-225 (manufactured by Asahi Glass Company, Limited)/methanol=2/1 (volume ratio) containing 0.5N hydrogen chloride. After the vacuum drying, 0.41 g of a prepolymer was obtained. The molecular weight measured by GPC was 7,100.

Example 16

Into a sample bottle, 1.51 g of the prepolymer in Preparation Example 10, 3.54 g of cyclohexanone and 0.078 g of TAZ-110 (manufactured by Midori Kagaku Co., Ltd.) as a photosensitizer were charged and dissolved. Such a solution was spin-coated on an Si wafer at a rate of 1,200 revolutions per minute for 30 seconds, followed by heating by a hot plate at 100° C. for 90 seconds. Then, a half of a substrate obtained by the spin-coating was shaded, and such a substrate was exposed at an irradiation energy of 1,530 mJ/cm$^2$, followed by baking at 180° C. for one minute. Then, the substrate was dipped in cyclohexanone for 30 seconds to carry out development, followed by spin-drying at a rate of 2,000 revolutions per minute for 30 seconds. Then, heating was carried out by a hot plate at 100° C. for 90 seconds and at 200° C. for 90 seconds. The film thickness of the exposed portion was 4.38 μm (92%), and the film thickness of the non-exposed portion was 0.32 μm (7%).

Preparation Example 12

5.43 g of the prepolymer in Preparation Example 9 was dissolved in 12.88 g of DMAc, and such a solution was added dropwise to 116.08 g of tert-amylalcohol with stirring for reprecipitation of a polymer. Such a precipitate was subjected to suction filtration and washed with tert-amylalcohol, followed by vacuum drying at 60° C. for 12 hours to obtain 4.77 g of a prepolymer. The molecular weight measured by GPC was 22,300.

Preparation Example 13

5.04 g of the prepolymer in Preparation Example 2 was dissolved in 11.91 g of DMAc, and such a solution was added dropwise to 111.69 g of tert-amylalcohol with stirring for reprecipitation of a polymer. Such a precipitate was subjected to suction filtration and washed with tert-amylalcohol, followed by vacuum drying at 60° C. for 12 hours to obtain 4.43 g of a prepolymer. The molecular weight measured by GPC was 9,700.

Example 17

Into a sample bottle, 1.50 g of the prepolymer in Preparation Example 12, 3.52 g of cyclohexanone, 0.046 g of IRGACURE 369 and 0.024 g of KAYACURE DETX-S as photosensitizers, were charged and dissolved. Such a solution was spin-coated at a rate of 1,800 revolutions per minute for 30 seconds, followed by heating by a hot plate at 100° C. for 90 seconds. Then, the exposure was carried out at an irradiation energy of 1,530 mJ/cm$^2$, followed by heating by a hot plate at 180° C. for one minute. Then, puddle development was carried out for 30 seconds with cyclohexanone, followed by spin-drying at a rate of 2,000 revolutions per minute for 30 seconds. Then, heating was carried out by a hot plate at 100° C. for 90 seconds and at 180° C. for 60 seconds. The film thickness of the exposed portion was 5.20 μm (98%).

Example 18

Into a sample bottle, 1.51 g of the prepolymer in Preparation Example 13, 3.52 g of cyclohexanone and 0.075 g of TAZ-110 were charged and dissolved. Such a solution was spin-coated at a rate of 1,000 revolutions per minute for 30 seconds, followed by heating by a hot plate at 100° C. for 90 seconds. Then, the exposure was carried out at an irradiation energy of 1,530 mJ/cm$^2$, followed by heating by a hot plate at 140° C. for one minute. Then, puddle development was carried out for 30 seconds with cyclohexanone, followed by spin-drying at a rate of 2,000 revolutions per minute for 30 seconds. Then, heating was carried out by a hot plate at 100°

C. for 90 seconds and at 180° C. for 60 seconds. The film thickness of the exposed portion was 5.48 μm (the same level of the thickness of a reference film).

Example 19

Into a sample bottle, 6.02 g of the prepolymer in Preparation Example 9, 14.0 g of cyclohexanone and 0.190 g of 2,6-bis(4-azidobenzal)-4-methylcyclohexanone were charged and dissolved. Such a solution was spin-coated at a rate of 1,850 revolutions per minute for 30 seconds, followed by heating by a hot plate at 100° C. for 90 seconds. Then, a half of a substrate obtained by the spin-coating was shaded, followed by exposure at an irradiation energy of 1,530 mJ/cm². Conditions for baking after the exposure were shown in Table 2. After baking under respective conditions, respective samples were dipped in cyclohexanone for 30 seconds, followed by development, and then spin-drying was carried out at a rate of 2,000 revolutions per minute for 30 seconds. Then, heating was carried out by a hot plate at 100° C. for 90 seconds and at 200° C. for 90 seconds. Conditions for baking (temperature and time) and film retention properties were as shown in Table 2.

TABLE 2

| Condition for baking after exposure | Film thickness of exposed portion (μm) | Film thickness of non-exposed portion (μm) |
|---|---|---|
| 100° C. for one min. | Ununiform film | Ununiform film |
| 120° C. for one min. | Ununiform film | 0.20 |
| 140° C. for one min. | 3.41 | 0.44 |
| 160° C. for one min. | 3.59 | 3.27 |
| 180° C. for one min. | 3.85 | 4.28 |
| 200° C. for one min. | 4.61 | 4.78 |
| No development was conducted (thickness of a reference film) | 4.84 | |

Example 20

Into a sample bottle, 6.04 g of the prepolymer in Preparation Example 9, 14.0 g of cyclohexanone and 0.180 g of IRGACURE OXE01 were charged and dissolved. Such a solution was spin-coated on an Si wafer at a rate of 1,850 revolutions per minute for 30 seconds, followed by heating by a hot plate at 100° C. for 90 seconds. Then, a half of a substrate obtained by the spin-coating was shaded, followed by exposure at an irradiation energy of 1,530 mJ/cm². Conditions for baking after the exposure were shown in Table 3. After baking under respective conditions, respective samples were subjected to puddle development for 25 seconds with cyclohexanone, and then spin-dried at a rate of 2,000 revolutions per minute for 30 seconds. Then, heating was carried out by a hot plate at 100° C. for 90 seconds and at 200° C. for 90 seconds. Conditions for baking (temperature and time) and film retention properties were as shown in Table 3.

TABLE 3

| Condition for baking after exposure | Film thickness of exposed portion (μm) | Film thickness of non-exposed portion (μm) |
|---|---|---|
| 100° C. for one min. | 3.38 | Less than 0.10 |
| 120° C. for one min. | 3.67 | Less than 0.10 |
| 140° C. for one min. | 3.73 | Less than 0.10 |
| 160° C. for one min. | 3.76 | Less than 0.10 |
| 180° C. for one min. | 4.03 | 0.13 |
| 200° C. for one min. | 4.43 | 3.23 |
| No development was conducted (thickness of a reference film) | 4.80 | |

Example 21

The same evaluation as in Example 20 was carried out except that the conditions for baking after exposure were fixed at 160° C. for one minute, and the conditions (time) for puddle development by cyclohexanone were changed, the development time and the film retention properties were as shown in Table 4.

TABLE 4

| Development time | Film thickness of exposed portion (μm) | Film thickness of non-exposed portion (μm) |
|---|---|---|
| 10 seconds | 4.18 | Ununiform film |
| 15 seconds | 4.15 | Ununiform film |
| 25 seconds | 3.74 | Less than 0.10 |
| 35 seconds | 3.44 | Less than 0.10 |
| 65 seconds | 3.26 | Less than 0.10 |
| 125 seconds | 3.08 | Less than 0.10 |
| No development was conducted (thickness of a reference film) | 4.75 | |

Example 22

The same evaluation as in Example 20 was carried out except that the conditions for baking after the exposure were fixed at 160° C. for one minute, the development time was fixed at 25 seconds, and the exposure energy was changed. The exposure energy and the film retention properties were as shown in Table 5.

TABLE 5

| Exposure energy (mJ/cm²) | Film thickness of exposed portion (μm) | Film thickness of non-exposed portion (μm) |
|---|---|---|
| 51 | 3.10 | Less than 0.10 |
| 153 | 3.15 | Less than 0.10 |
| 306 | 3.47 | Less than 0.10 |
| 612 | 3.55 | Less than 0.10 |
| 918 | 3.52 | Less than 0.10 |
| 1,224 | 3.65 | Less than 0.10 |

Example 23

Into a sample bottle, 1.99 g of the prepolymer in Preparation Example 9, 4.67 g of cyclohexanone and 0.040 g of IRGACURE OXE01 were charged and dissolved. Such a solution was spin-coated on an Si wafer at a rate of 1,850 revolutions per minute for 30 seconds, followed by heating by a hot plate at 100° C. for 90 seconds. A half of a substrate obtained by spin-coating was shaded, and studying was carried out by changing an exposure energy. After the exposure, baking was carried out at 160° C. for one minute, and then puddle development was carried out with cyclohexanone for 25 seconds, followed by spin-drying at a rate of 2,000 revolutions per minute for 30 seconds. Then, heating was carried out by a hot plate at 100° C. for 90 seconds and at 200° C. for 90 seconds. The relationships between the exposure energy and the film thickness were as shown in Table 6.

TABLE 6

| Exposure energy (mJ/cm$^2$) | Film thickness of exposed portion (μm) | Film thickness of non-exposed portion (μm) |
|---|---|---|
| 51 | Ununiform film | Less than 0.10 |
| 153 | 3.06 | Less than 0.10 |
| 306 | 3.18 | Less than 0.10 |
| 612 | 3.19 | Less than 0.10 |
| 918 | 3.31 | Less than 0.10 |
| 1,530 | 3.40 | Less than 0.10 |
| No development was conducted (thickness of a reference film) | 4.61 | |

Example 24

The same evaluation as in Example 23 was carried out except that the amount of the prepolymer was changed to 2.00 g, the amount of cyclohexanone was changed to 4.67 g, and the amount of IRGACURE OXE01 was changed to 0.020 g. The relationships between the exposure energy and the film retention properties were as shown in Table 7.

TABLE 7

| Exposure energy (mJ/cm$^2$) | Film thickness of exposed portion (μm) | Film thickness of non-exposed portion (μm) |
|---|---|---|
| 612 | 3.14 | Less than 0.10 |
| 918 | 3.04 | Less than 0.10 |
| 1,530 | 3.08 | Less than 0.10 |
| No development was conducted (thickness of a reference film) | 4.65 | |

Example 25

Into a sample bottle, 1.00 g of the prepolymer in Preparation Example 9, 2.34 g of cyclohexanone and 0.010 g of IRGACURE OXE02 (manufactured by Ciba Specialty Chemicals K.K.) as a photosensitizer were charged and dissolved. Such a solution was spin-coated on an Si wafer at a rate of 1,850 revolutions per minute for 30 seconds, followed by heating by a hot plate at 100° C. for 90 seconds. A half of a substrate obtained by spin-coating was shaded, followed by exposure at an exposure energy of 1,530 mJ/cm$^2$. After baking at 160° C. for one minute, puddle development was carried out for two minutes by using propylene glycol monomethyl ether acetate, and rinsing was carried out for 30 seconds by using 2-propanol. Then, spin-drying was carried out at a rate of 2,000 revolutions per minute for 30 seconds, and heating was carried out by a hot plate at 100° C. for 90 seconds and at 200° C. for 90 seconds. The film thickness at an exposed portion was 2.78 μm (59%), and the film thickness at a non-exposed portion was at most 0.1 μm.

Example 26

The same study as in Example 25 was carried out except that the amount of IRGACURE OXE02 as a photosensitizer was changed to 0.020 g, and found that the film thickness at an exposed portion was 3.18 μm (65%) and the film thickness at a non-exposed portion was at most 0.1 μm.

Example 27

The same study as in Example 25 was carried out except that the amount of IRGACURE OXE02 as a photosensitizer was changed to 0.030 g, and found that the film thickness at an exposed portion was 3.46 μm (70%) and the film thickness at a non-exposed portion was at most 0.1 μm.

Example 28

Into a sample bottle, 1.00 g of the prepolymer in Preparation Example 2, 2.34 g of cyclohexanone and 0.010 g of IRGACURE OXE02 as a photosensitizer were charged and dissolved. Such a solution was spin-coated on an Si wafer at a rate of 1,000 revolutions per minute for 30 seconds, followed by heating by a hot plate at 100° C. for 90 seconds. A half of a substrate obtained by spin-coating was shaded, and exposure was carried out at an exposure energy of 1,530 mJ/cm$^2$. After baking at 140° C. for one minute, puddle development was carried out for two minutes by using propylene glycol monomethyl acetate, and rinsing was carried out for 30 seconds by using 2-propanol. Then, spin-drying was carried out at a rate of 2,000 revolutions per minute for 30 seconds, and heating was carried out by a hot plate at 100° C. for 90 seconds and at 200° C. for 90 seconds. The film thickness at an exposed portion was 2.07 μm (45%), and the film thickness at a non-exposed portion was at most 0.1 μm.

Example 29

The same study as in Example 28 was carried out except that the amount of IRGACURE OXE02 as a photosensitizer was changed to 0.020 g, and found that the film thickness at an exposed portion was 2.63 μm (56%) and the film thickness at a non-exposed portion was at most 0.1 μm.

Example 30

The same study as in Example 28 was carried out except that the amount of IRGACURE OXE02 as a photosensitizer was changed to 0.030 g, and found that the film thickness at an exposed portion was 2.96 μm (62%) and the film thickness at a non-exposed portion was at most 0.1 μm.

Example 31

Into a sample bottle, 35 g of the prepolymer in Preparation Example 9, 65 g of cyclohexanone and 1.05 g of IRGACURE OXE01 as a photosensitizer were charged and dissolved. A 2-propanol solution (the concentration was 0.1 mass %) of 3-aminopropyltriethoxysilane was spin-coated on an Si wafer at a rate of 3,000 revolutions per minute for 30 seconds, followed by heating by a hot plate at 200° C. for 90 seconds. Then, such a prepolymer solution was spin-coated at a rate of 1,000 revolutions per minute for 30 seconds, followed by heating by a hot plate at 100° C. for 90 seconds. On a substrate obtained by spin-coating, a mask having a line-and-space test pattern was disposed on the upper portion of the substrate with vacuum contact mode, and the substrate was exposed through such a mask where the exposure energy would be 1,530 mJ/cm$^2$. Then, after baking at 160° C. for one minute, puddle development was carried out for 30 seconds by using propylene glycol monomethyl acetate, and rinsing was carried out for 30 seconds by using 2-propanol. Then, spin-drying was carried out at a rate of 2,000 revolutions per minute for 30 seconds, and heating was carried out by a hot plate at 100° C. for 90 seconds and at 200° C. for 90 seconds. The film thickness at an exposed portion was 10.2 μm (90%), and the film thickness at a non-exposed portion was at most 0.1 μm. A pattern was confirmed by SEM (scanning electron microscope) and a 30 μm concavo-convex pattern was confirmed.

Descum was carried out for one minute under conditions where oxygen gas was 50 sccm, the pressure was 10 Pa, and the Rf power was 60 W, whereby 0.17 μm of the exposed portion was etched, and the remaining film at the non-exposed portion completely disappeared. The surface roughness of the exposed portion before and after the etching was changed from 0.21 nm to 0.39 nm.

Example 32

Into a sample bottle, 7.14 g of the prepolymer in Preparation Example 9, 13.27 g of cyclohexanone and 0.22 g of IRGACURE OXE01 were charged and dissolved. Such a solution was subjected to potting on an Si substrate, and cured in a nitrogen atmosphere at 320° C. for 30 minutes. Such a cured polymer was subjected to moisture uptake measurement under a relative humidity of 85% at 85° C. by IGA Sorp manufactured by Hiden Analytical Ltd., and the measurement value was 0.3%.

Comparative Example 1

Semicofine SP-483 (manufactured by Toray Industries, Inc.) was subjected to potting on an Si substrate, followed by curing in a nitrogen atmosphere at 140° C. for 30 minutes, at 250° C. for 30 minutes and at 350° C. for one hour. Such a cured polymer was subjected to moisture uptake measurement under a relative humidity of 85% at 85° C. by IGA Sorp manufactured by Hiden Analytical Ltd., and the measurement value was 3.32%.

Example 33

Into a sample bottle, 0.51 g of the prepolymer in Preparation Example 9, 2.50 g of cyclohexanone and 0.015 g of IRGACURE OXE01 were charged and dissolved. Such a solution was spin-coated on an Si wafer at a rate of 3,000 revolutions for 30 seconds, and heated by a hot plate at 100° C. for 90 seconds and at 200° C. for 90 seconds. Then, curing was carried out at 350° C. for one hour in a nitrogen atmosphere. The permittivity of such a cured film was measured, and found to be 2.55.

Example 34

Into a sample bottle, 7.14 g of the prepolymer in Preparation Example 9, 13.27 g of cyclohexanone and 0.22 g of IRGACURE OXE01 were charged and dissolved. Such a solution was spin-coated on an Si wafer having Cu laminated thereon, at a rate of 1,500 revolutions per minute for 30 seconds, followed by heating by a hot plate at 100° C. for 90 seconds. Then, exposure was carried out at an exposure energy of 1,530 mJ/cm$^2$, and after baking at 160° C. for one minute, puddle development was carried out for 30 seconds by using propylene glycol monomethyl acetate, and rinsing was carried out for 30 seconds by using 2-propanol. Then, spin-drying was carried out at a rate of 2,000 revolutions per minute for 30 seconds, followed by heating by a hot plate at 100° C. for 90 seconds and at 200° C. for 90 seconds, and further curing was carried out at 320° C. for 30 minutes in a nitrogen atmosphere. A cured film obtained was dipped in an 0.15M ammonium persulfate aqueous solution to dissolve copper. Then, such a cured film was dipped in deionized water for three hours, followed by drying at room temperature for 24 hours to obtain a self-supporting film with a thickness of 10 μm. Such a film was cut out into a rectangle, the physical property values of the film were measured by TMA (thermal mechanical analysis). The elastic modulus was 1.7 GPa, tensile strength was 73 MPa and elongation at break was 8%.

Example 35

The solution prepared in Example 32 was subjected to potting on an Si substrate, followed by curing in a nitrogen atmosphere at 350° C. for one hour. The weight reduction was measured in a case where such a cured polymer was maintained at 350° C. in a nitrogen atmosphere, and found to be 0.17 mass %/1 hr.

As a reference, the value read-out from a catalog chart of an insulation material (tradename: CYCLOTENE) (CYCLOTENE 4026-46 resin) manufactured by The Dow Chemical Company) was 1.8 mass %/1 hr.

Preparation Example 14

Into a 5 L glass four-necked flask equipped with a Dimroth condenser, a thermocouple thermometer and a mechanical stirrer, perfluorobiphenyl (225 g), 1,3,5-trihydroxybenzene (40 g), a powdery molecular sieves 4A (153 g) and DMAc (2,388 g) were charged. The mixture was heated on an oil bath with stirring, and when the liquid temperature become 60° C., sodium carbonate (153 g) was quickly added thereto. Heating was carried out at 60° C. for 37 hours with continuous stirring. Then, the reaction solution was cooled to room temperature and gradually added dropwise to about 14 L of 0.5N aqueous hydrochloric acid solution with vigorous stirring for reprecipitation. The precipitate was collected by filtration, and then washed twice with pure water. Then, vacuum drying was carried out at 70° C. for 12 hours to obtain a white powdery prepolymer intermediate (242 g). The molecular weight was 7,824.

Preparation Example 15

Into a 5 L glass four-necked flask equipped with a Dimroth condenser, a thermocouple thermometer and a mechanical stirrer, the prepolymer intermediate (120 g) obtained in Preparation Example 14, 4-acetoxystyrene (30 g) and diethylene glycol dimethyl ether (1,344 g) were charged. Further, a 48% potassium hydroxide aqueous solution (64 g) was charged thereto at room temperature with stirring, and then stirring was carried out for 15 hours at room temperature. Then, such a solution was gradually added dropwise to about 7 L of 0.5N aqueous hydrochloric acid solution with vigorous stirring for reprecipitation. The precipitate was collected by filtration, and then washed twice with pure water. Then, vacuum drying was carried out at 70° C. for 12 hours to obtain a white powdery prepolymer (106 g). The prepolymer obtained had ether bonds and vinyl groups. The molecular weight was 7,764.

Preparation Example 16

Into a 1 L glass four-necked flask equipped with a Dimroth condenser, a thermocouple thermometer and a mechanical stirrer, the prepolymer intermediate (35 g) obtained in Preparation Example 14, 4-acetoxystyrene (7.3 g) and diethylene glycol dimethyl ether (380 g) were charged. Further, a 48% potassium hydroxide aqueous solution (16 g) was charged thereto at room temperature with stirring, and stirring was carried out for 15 hours at room temperature. Then, the solution was gradually added dropwise to about 2 L of 0.5N aqueous hydrochloric acid solution with vigorous stirring for reprecipitation. The precipitate was collected by filtration, and then washed twice with pure water. Then, vacuum drying was carried out at 70° C. for 12 hours to obtain a white powdery prepolymer (38 g). The prepolymer obtained had ether bonds and vinyl groups. The molecular weight was 8,264.

Example 36

Into a sample bottle, 8.00 g of the prepolymer in Preparation Example 15, 9.54 g of propylene glycol monomethyl acetate and 0.24 g of DAROCUR TPO were charged and dissolved. Such a solution was spin-coated on an Si wafer with Cu-laminated, at a rate of 800 revolutions per minute for 30 seconds, followed by heating by a hot plate at 80° C. for 90 seconds. Then, exposure was carried out at an exposure energy of 1,530 mJ/cm$^2$, puddle development was carried out twice for 20 seconds by using propylene glycol monomethyl acetate, and rinsing was carried out for 30 seconds by using propylene glycol monomethyl acetate. Then, spin-drying was carried out at a rate of 3,000 revolutions for 30 seconds, heating was carried out by a hot plate at 100° C. for 90 seconds, and further curing was carried out in a nitrogen atmosphere at 190° C. for 120 minutes. A cured film obtained was dipped in a 0.15M ammonium persulfate aqueous solution at 50° C. for one hour to let copper dissolve therein. Then, such a film was dipped in deionized water for three hours, followed by drying at room temperature for 24 hours to obtain a self-supporting film with a thickness of 20 μm. Such a self-supporting film was cut out into a rectangle to measure physical properties by using a TENSILON universal material testing instrument (model RTC-1210, manufactured by A&D Company, Limited). The elastic modulus was 1.4 GPa, the tensile strength was 87 MPa and the elongation at break was 18%.

INDUSTRIAL APPLICABILITY

By using the negative photosensitive fluorinated aromatic resin composition of the present invention, it is possible to readily form a resin layer having a low permittivity, provided with a pattern. Thus, it is possible to readily and inexpensively produce a semiconductor device.

The entire disclosures of Japanese Patent Application No. 2006-072412 filed on Mar. 16, 2006 and Japanese Patent Application No. 2006-291396 filed on Oct. 26, 2006 including specifications, claims and summaries are incorporated herein by reference in their entireties.

What is claimed is:

1. A fluorinated aromatic resin film having a concavo-convex shape, which is obtained by coating a substrate with a negative photosensitive fluorinated aromatic resin composition to form a negative photosensitive fluorinated aromatic resin composition film, followed by exposure and development, wherein the negative photosensitive fluorinated aromatic resin composition comprises the following fluorinated aromatic prepolymer, at least one photosensitizer and at least one solvent, wherein the fluorinated aromatic prepolymer is obtained by subjecting either one or both of a compound (Y-1) having a crosslinkable functional group (A) and a phenolic hydroxyl group, and a compound (Y-2) having a crosslinkable functional group (A) and a fluorinated aromatic ring, to a condensation reaction in the presence of a HF-removing agent, with a fluorinated aromatic compound (B) represented by the following formula (1):

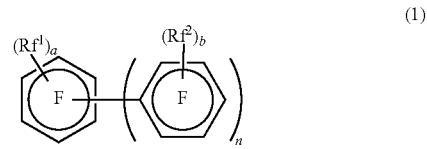

wherein n is an integer of from 0 to 3, each of a and b which are independent of each other, is an integer of from 0 to 3, each of Rf$^1$ and Rf$^2$ which may be the same or different from each other, is a fluorinated alkyl group having at most 8 carbon atoms, and F in the aromatic ring represents that hydrogen atoms of the aromatic ring are all substituted by fluorine atoms, and a compound (C) having at least 3 phenolic hydroxyl groups, and which has crosslinkable functional groups (A) and ether bonds and has a number average molecular weight of from 1×10$^3$ to 5×10$^5$.

2. The fluorinated aromatic resin film of claim 1, wherein the photosensitizer is contained in an amount of from 0.1 to 30 parts by mass, based on 100 parts by mass of the fluorinated aromatic prepolymer.

3. The fluorinated aromatic resin film of claim 1, wherein the photosensitizer is a photo initiator, a photoacid generator, a photobase generator or a photocrosslinking agent.

4. The fluorinated aromatic resin film of claim 1, wherein the solvent is at least one member selected from the group consisting of an aromatic hydrocarbon, a dipolar aprotic solvent, a ketone, an ester, an ether or a halogenated hydrocarbon.

5. The fluorinated aromatic resin film of claim 1, wherein the HF-removing agent is sodium carbonate, potassium carbonate, sodium hydrogencarbonate, potassium hydrogencarbonate, sodium hydroxide or potassium hydroxide.

6. The fluorinated aromatic resin film of claim 1, wherein the compound (Y-1) or the compound (Y-2) is a phenol having a reactive double bond or triple bond, or a fluorinated aryl having a reactive double bond or triple bond.

7. The fluorinated aromatic resin film of claim 1, wherein the fluorinated aromatic compound (B) is perfluorotoluene, perfluorobiphenyl, perfluoro(1,3,5-triphenylbenzene) or perfluoro(1,2,4-triphenylbenzene).

8. The fluorinated aromatic resin film of claim 1, wherein the compound (C) is trihydroxybenzene or 1,1,1-tris(4-hydroxyphenyl)ethane.

9. The fluorinated aromatic resin film of claim 1, wherein the negative photosensitive fluorinated aromatic resin composition film has a thickness of from about 0.01 to 500 μm.

10. The fluorinated aromatic resin film of claim 1, wherein the negative photosensitive fluorinated aromatic resin composition film has a thickness of from about 0.1 to 300 μm.

11. An electric component, electronic component or optical component comprising the fluorinated aromatic resin film of claim 1.

12. A method of making the fluorinated aromatic resin film of claim 1, comprising coating the substrate with the negative photosensitive fluorinated aromatic resin composition to form a negative photosensitive fluorinated aromatic resin composition film, followed by exposure and development.

* * * * *